US012694942B2

(12) United States Patent
    Kale et al.

(10) Patent No.: US 12,694,942 B2
(45) Date of Patent:      Jul. 28, 2026

(54) BINARY SEARCH BIT ERROR RATE ESTIMATION SCAN FOR NON-VOLATILE MEMORY APPARATUS

(71) Applicant: Sandisk Technologies, Inc., Milpitas, CA (US)

(72) Inventors: Salil Kale, San Jose, CA (US); Vishwanath Basavaegowda Shanthakumar, Milpitas, CA (US); Qing Li, Los Gatos, CA (US); Henry Chin, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 215 days.

(21) Appl. No.: 18/219,387

(22) Filed: Jul. 7, 2023

(65) Prior Publication Data

US 2024/0185943 A1      Jun. 6, 2024

Related U.S. Application Data

(60) Provisional application No. 63/429,648, filed on Dec. 2, 2022.

(51) Int. Cl.
    *G11C 29/44*      (2006.01)
    *G11C 29/12*      (2006.01)
    *G11C 29/42*      (2006.01)

(52) U.S. Cl.
    CPC .......... *G11C 29/44* (2013.01); *G11C 29/1201* (2013.01); *G11C 29/42* (2013.01)

(58) Field of Classification Search
    CPC ...... G11C 29/44; G11C 29/1201; G11C 29/42
    See application file for complete search history.

(56) References Cited

U.S. PATENT DOCUMENTS

| | | | |
|---|---|---|---|
| 9,691,501 B2 | 6/2017 | Tarsi et al. | |
| 9,697,905 B2 | 7/2017 | Sharon et al. | |
| 9,996,281 B2 | 6/2018 | Sharon et al. | |
| 10,535,383 B2 | 1/2020 | Thalaimalaivanaraj | |
| 10,998,041 B1 | 5/2021 | Avraham et al. | |
| 2014/0359202 A1 | 12/2014 | Sun et al. | |
| 2017/0148510 A1* | 5/2017 | Bazarsky ............ | G11C 11/5642 |
| 2017/0271031 A1* | 9/2017 | Sharon ................... | G11C 29/52 |
| 2021/0383886 A1 | 12/2021 | Alrod et al. | |
| 2022/0113894 A1 | 4/2022 | Avraham et al. | |

FOREIGN PATENT DOCUMENTS

CN            114038494 A      2/2022

* cited by examiner

*Primary Examiner* — Alfredo Bermudez Lozada
(74) *Attorney, Agent, or Firm* — Dickinson Wright PLLC

(57)      ABSTRACT

A memory apparatus and operating method are provided. The apparatus includes memory cells configured to retain a threshold voltage. A control means is configured to read the memory cells using a primary set of read level offsets and determine a value of an error metric for each of the primary set of read level offsets. The control means reads the memory cells using a secondary set of read level offsets based on the value of the error metric for each of the read level offsets of the primary set and determines the value of the error metric for each of the secondary set of read level offsets. The control means is also configured to read the memory cells at an optimum read level determined based on analysis of the value of the error metric for each of the read level offsets of both the primary set and the secondary set.

6 Claims, 17 Drawing Sheets

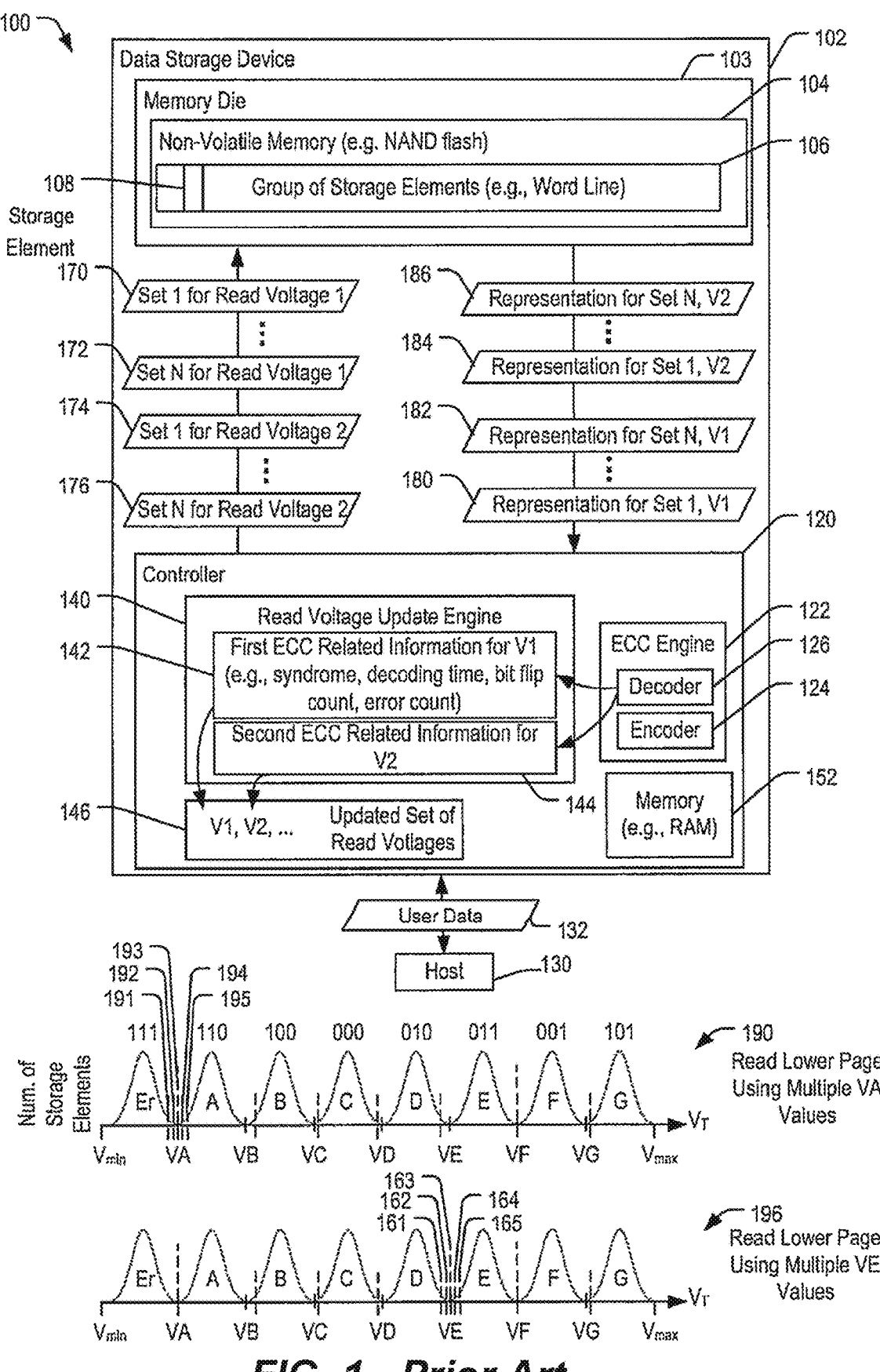
FIG. 1 - Prior Art

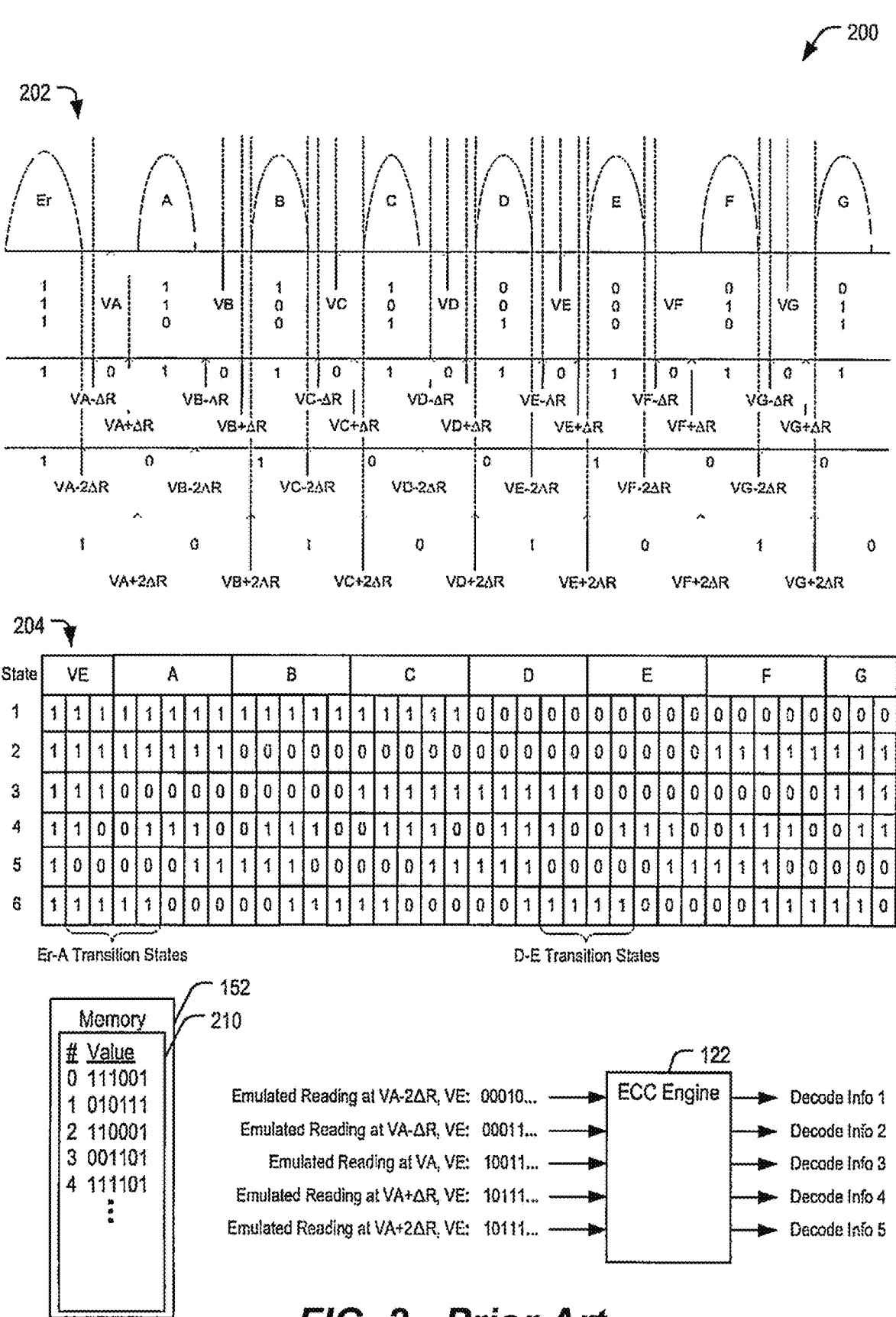
FIG. 2 - Prior Art

300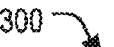

┌─────────────────────────────────────────────────────────────────────┐ ⌐ 302
│ Iteratively adjust a first read voltage without adjusting a second read voltage to form first sets of │
│ read voltages │
└─────────────────────────────────────────────────────────────────────┘

┌─────────────────────────────────────────────────────────────────────┐ ⌐ 304
│ Read multiple first representations of data from the non-volatile memory according to the first │
│ sets of read voltages │
└─────────────────────────────────────────────────────────────────────┘

┌─────────────────────────────────────────────────────────────────────┐ ⌐ 306
│ Select a first value of the first read voltage based on first ECC related information from an error │
│ correction coding (ECC) decoder, the first ECC related information responsive to the multiple first │
│ representations of the data │
└─────────────────────────────────────────────────────────────────────┘

┌─────────────────────────────────────────────────────────────────────┐ ⌐ 308
│ Iteratively adjust the second read voltage without adjusting the first read voltage to form second │
│ sets of read voltages │
└─────────────────────────────────────────────────────────────────────┘

┌─────────────────────────────────────────────────────────────────────┐ ⌐ 310
│ Read multiple second representations of the data from the non-volatile memory according to the │
│ second sets of read voltages │
└─────────────────────────────────────────────────────────────────────┘

┌─────────────────────────────────────────────────────────────────────┐ ⌐ 312
│ Select a second value of the second read voltage based on second ECC rekated information │
│ from the ECC decoder, the second ECC related information responsive to the multiple second │
│ representations of the data │
└─────────────────────────────────────────────────────────────────────┘

┌─────────────────────────────────────────────────────────────────────┐ ⌐ 314
│ Store an updated set of the read voltages that includes the first value and the second value │
└─────────────────────────────────────────────────────────────────────┘

*FIG. 3 - Prior Art*

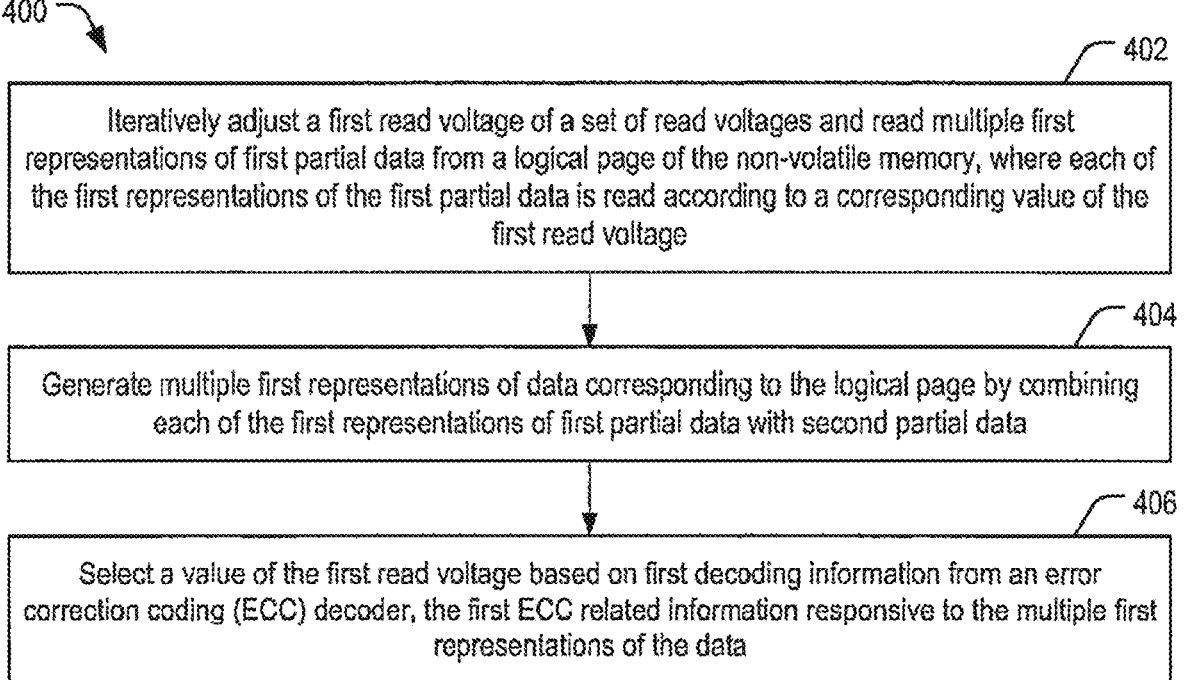

400

402

Iteratively adjust a first read voltage of a set of read voltages and read multiple first representations of first partial data from a logical page of the non-volatile memory, where each of the first representations of the first partial data is read according to a corresponding value of the first read voltage

404

Generate multiple first representations of data corresponding to the logical page by combining each of the first representations of first partial data with second partial data

406

Select a value of the first read voltage based on first decoding information from an error correction coding (ECC) decoder, the first ECC related information responsive to the multiple first representations of the data

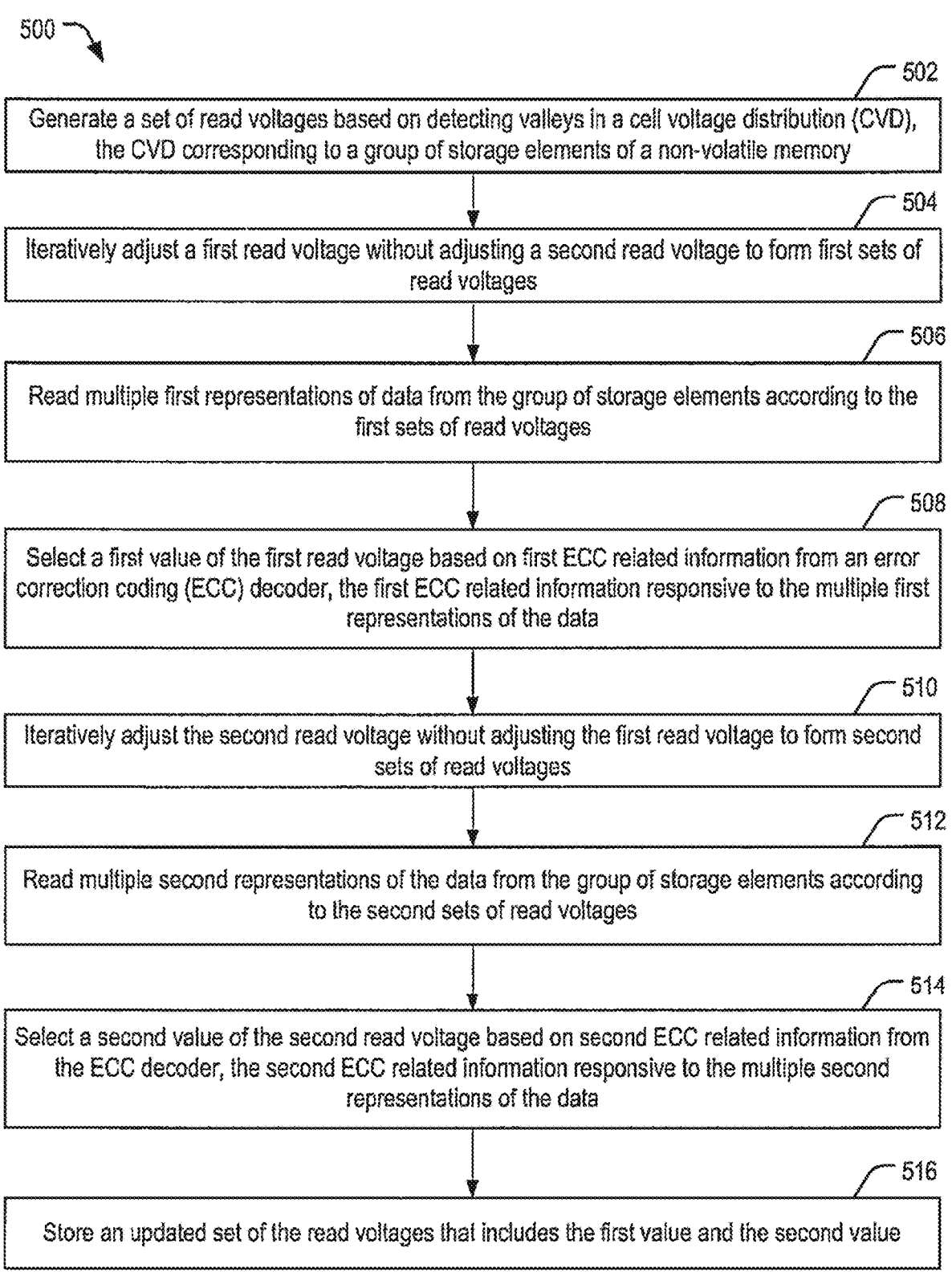

502

Generate a set of read voltages based on detecting valleys in a cell voltage distribution (CVD), the CVD corresponding to a group of storage elements of a non-volatile memory

504

Iteratively adjust a first read voltage without adjusting a second read voltage to form first sets of read voltages

506

Read multiple first representations of data from the group of storage elements according to the first sets of read voltages

508

Select a first value of the first read voltage based on first ECC related information from an error correction coding (ECC) decoder, the first ECC related information responsive to the multiple first representations of the data

510

Iteratively adjust the second read voltage without adjusting the first read voltage to form second sets of read voltages

512

Read multiple second representations of the data from the group of storage elements according to the second sets of read voltages

514

Select a second value of the second read voltage based on second ECC related information from the ECC decoder, the second ECC related information responsive to the multiple second representations of the data

516

Store an updated set of the read voltages that includes the first value and the second value

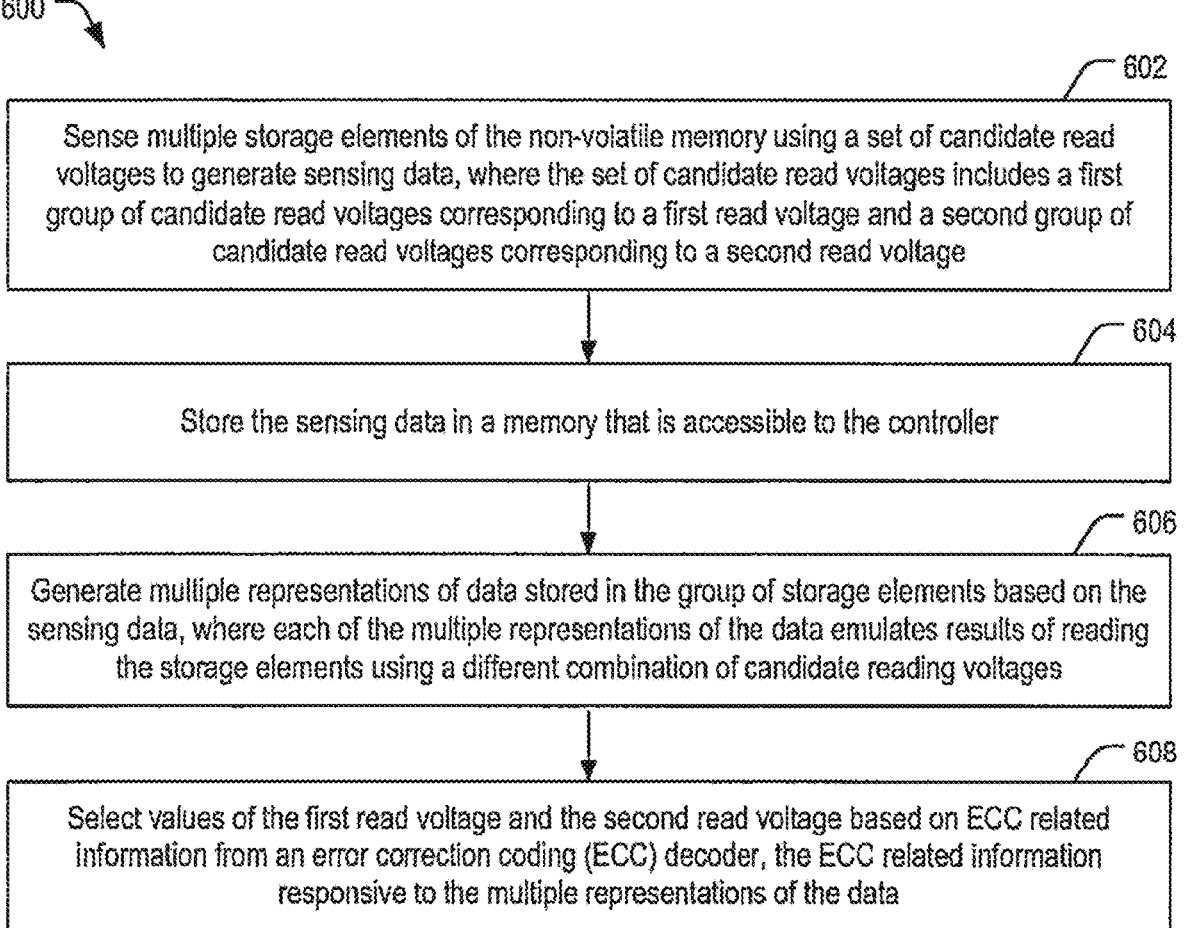

602

Sense multiple storage elements of the non-volatile memory using a set of candidate read voltages to generate sensing data, where the set of candidate read voltages includes a first group of candidate read voltages corresponding to a first read voltage and a second group of candidate read voltages corresponding to a second read voltage

604

Store the sensing data in a memory that is accessible to the controller

606

Generate multiple representations of data stored in the group of storage elements based on the sensing data, where each of the multiple representations of the data emulates results of reading the storage elements using a different combination of candidate reading voltages

608

Select values of the first read voltage and the second read voltage based on ECC related information from an error correction coding (ECC) decoder, the ECC related information responsive to the multiple representations of the data

*FIG. 6 - Prior Art*

700
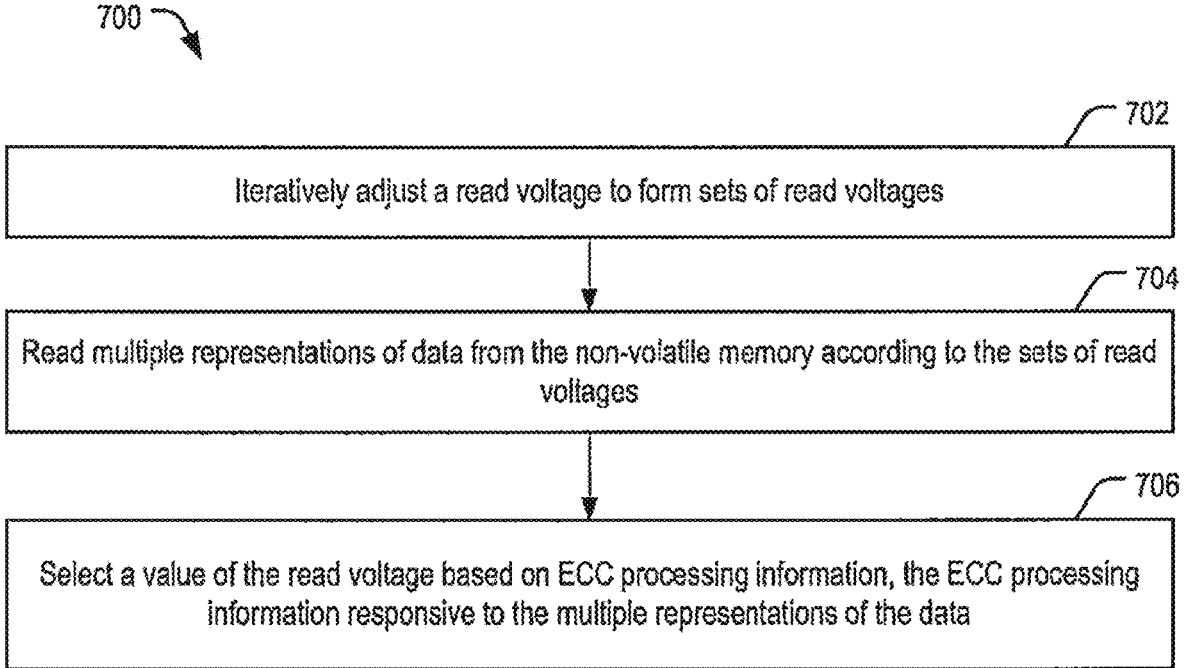
702
Iteratively adjust a read voltage to form sets of read voltages
704
Read multiple representations of data from the non-volatile memory according to the sets of read voltages
706
Select a value of the read voltage based on ECC processing information, the ECC processing information responsive to the multiple representations of the data
*FIG. 7 - Prior Art*

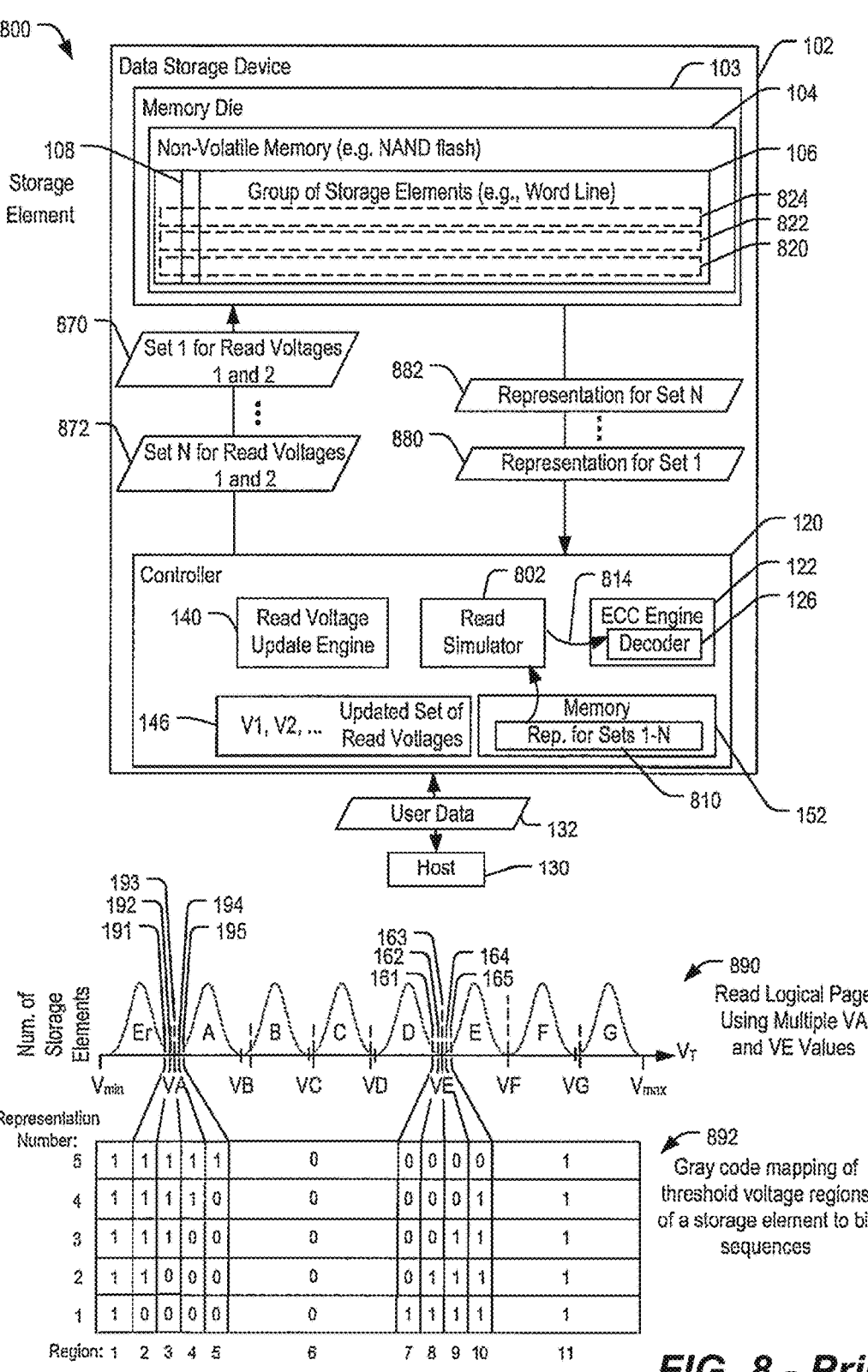
FIG. 8 - Prior Art -

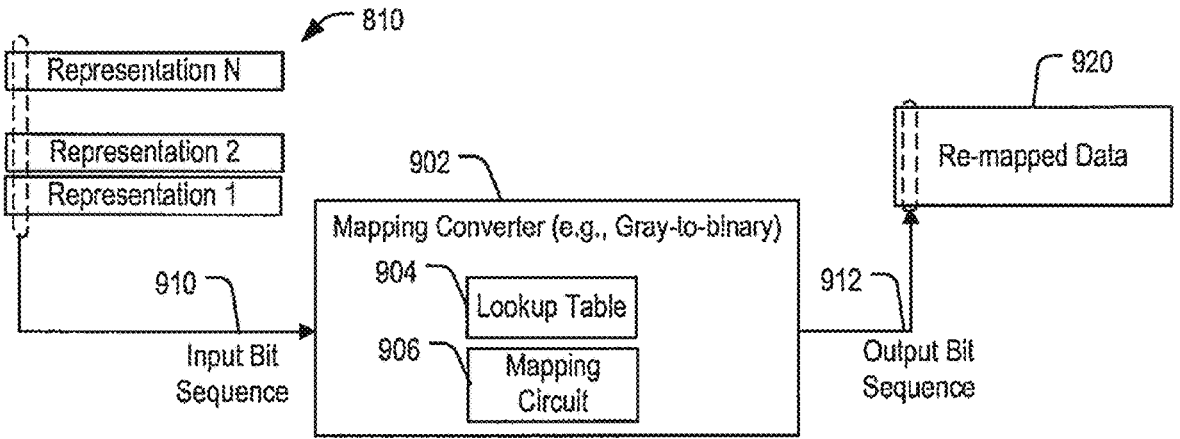
FIG. 9 - Prior Art -
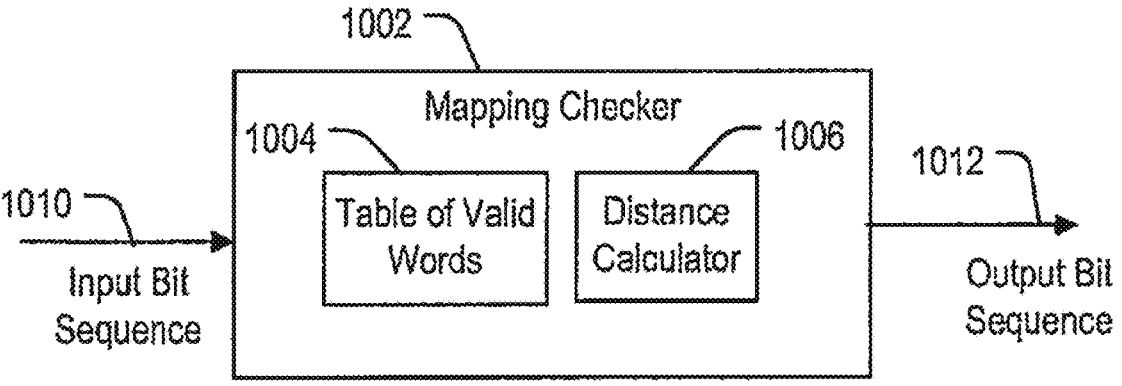
FIG. 10 - Prior Art -

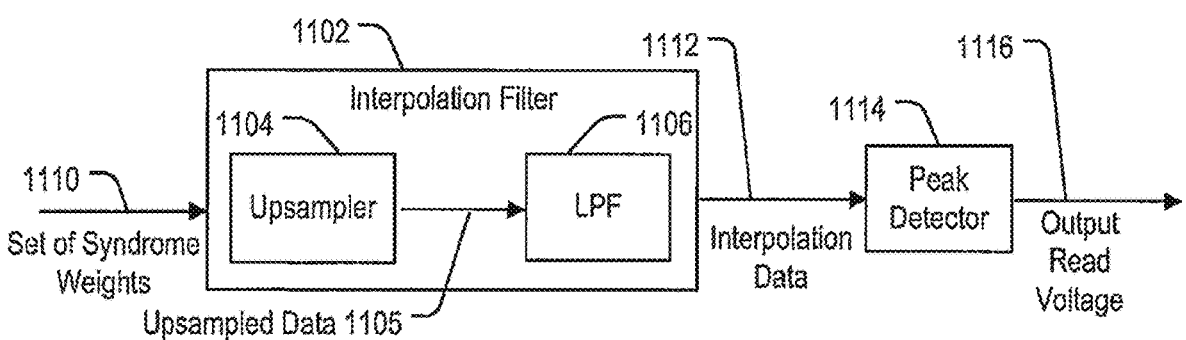
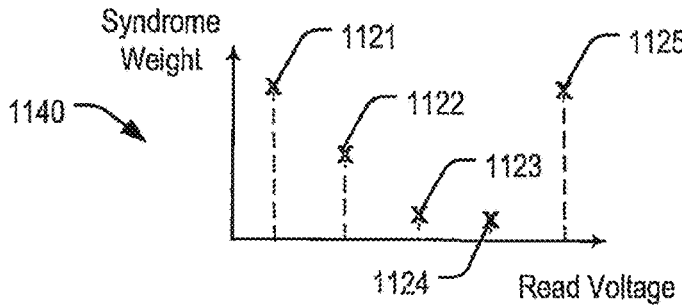
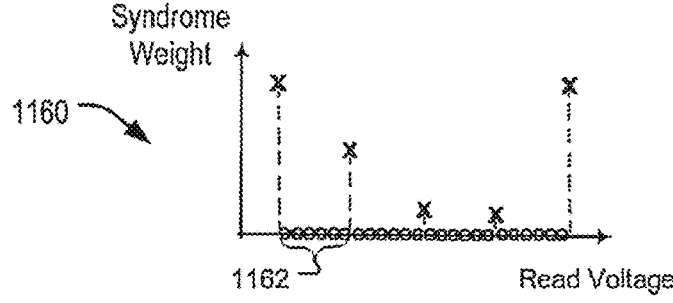
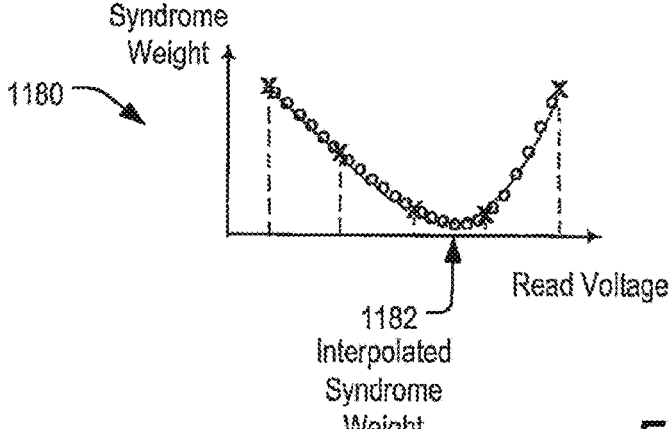
*FIG. 11 - Prior Art -*

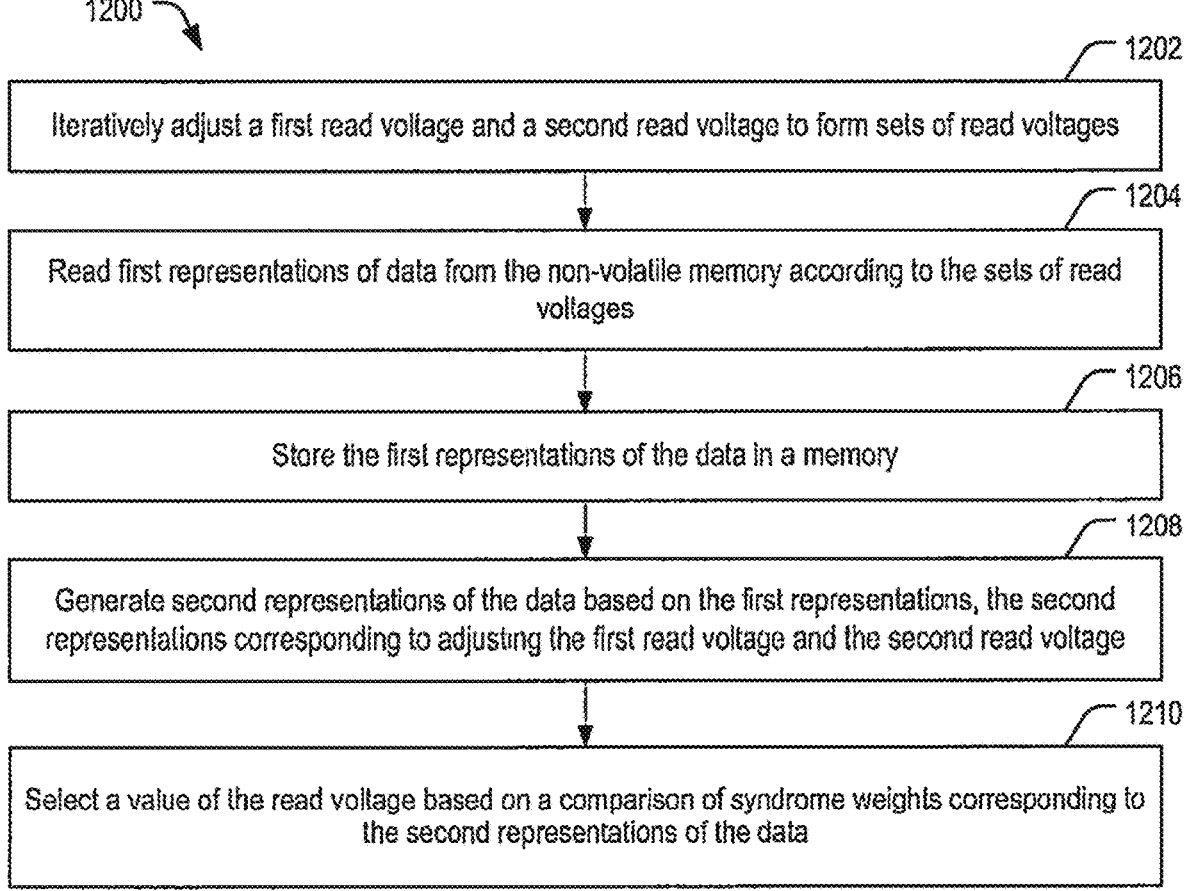

1200

1202
Iteratively adjust a first read voltage and a second read voltage to form sets of read voltages 1204
Read first representations of data from the non-volatile memory according to the sets of read voltages 1206
Store the first representations of the data in a memory 1208
Generate second representations of the data based on the first representations, the second representations corresponding to adjusting the first read voltage and the second read voltage 1210
Select a value of the read voltage based on a comparison of syndrome weights corresponding to the second representations of the data

*FIG. 12 - Prior Art -*

MAIN POSSIBLE RESULTS:

i.   OA < OB < OC
ii.  OA ≈ OB < OC
iii. OA > OB ≈ OC
iv.  OA ≈ OB > OC (LOCAL MINIMA AROUND OC)
v.   OA < OB ≈ OC (LOCAL MINIMA AROUND OA)
vi.  OA > OB > OC
vii. OA > OB < OC

| CASE NUM | SW/FBC COMPARIONS (-140 a.u.; 0 a.u.; +140 a.u.) | P1 | P2 | P3 | P4 | P5 |
|---|---|---|---|---|---|---|
| C1.1 | OA" < OA' < OA < OB < OC | -420 | -280 | -140 | 0 | +140 |
| C1.2 | OA" ≥ OA' < OA < OB < OC | -420 | -280 | -140 | 0 | +140 |
| C2 | OA' > OA ≈ OB < OC < OC' | -280 | -140 | 0 | +140 | +280 |
| C3 | OA > OB < OC < OC'; OA ≈ OB > OC; OA < OB ≈ OC | -280 | -140 | 0 | +140 | +280 |
| C4 | OA' > OA > OB > OC < OC' | -280 | -140 | 0 | +140 | +280 |
| C5.1 | OA > OB > OC > OC' ≤ OC" | -140 | 0 | +140 | +280 | +420 |
| C5.2 | OA > OB > OC > OC' > OC" | -140 | 0 | +140 | +280 | +420 |

*FIG. 17*

| CASE NUM | SW/FBC COMPARIONS (-70 a.u.; 0 a.u.; +70 a.u.) | P1 | P2 | P3 | P4 | P5 | P6 | P7 |
|---|---|---|---|---|---|---|---|---|
| C1.1 | OA" < OA' < OA < OB < OC | -700 | -630 | -560 | -490 | -420 | -350 | -280 |
| C1.2 | OA" ≳ OA' < OA < OB < OC | -420 | -350 | -280 | -210 | -140 | -70 | 0 |
| C2 | OA' > OA ≈ OB < OC < OC' | -280 | -210 | -140 | -70 | 0 | +70 | +140 |
| C3 | OA > OB < OC; OA ≈ OB > OC; OA < OB ≈ OC | -210 | -140 | -70 | 0 | +70 | +140 | +210 |
| C4 | OA' > OA ≈ OB ≈ OC < OC' | -140 | -70 | 0 | +70 | +140 | +210 | +280 |
| C5.1 | OA > OB > OC > OC' ≤ OC" | 0 | +70 | +140 | +210 | +280 | +350 | +420 |
| C5.2 | OA > OB > OC > OC' > OC" | +280 | +350 | +420 | +490 | +560 | +630 | +700 |

*FIG. 19*

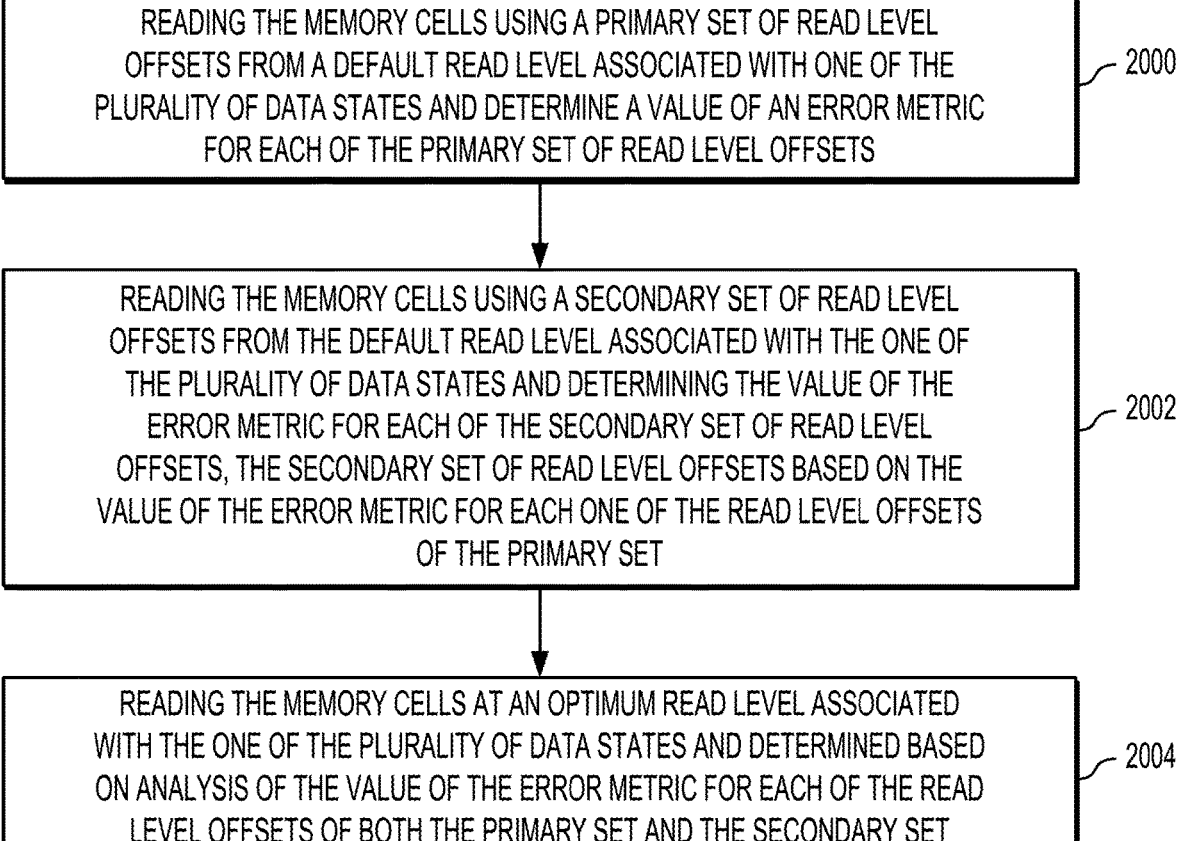

READING THE MEMORY CELLS USING A PRIMARY SET OF READ LEVEL OFFSETS FROM A DEFAULT READ LEVEL ASSOCIATED WITH ONE OF THE PLURALITY OF DATA STATES AND DETERMINE A VALUE OF AN ERROR METRIC FOR EACH OF THE PRIMARY SET OF READ LEVEL OFFSETS — 2000

READING THE MEMORY CELLS USING A SECONDARY SET OF READ LEVEL OFFSETS FROM THE DEFAULT READ LEVEL ASSOCIATED WITH THE ONE OF THE PLURALITY OF DATA STATES AND DETERMINING THE VALUE OF THE ERROR METRIC FOR EACH OF THE SECONDARY SET OF READ LEVEL OFFSETS, THE SECONDARY SET OF READ LEVEL OFFSETS BASED ON THE VALUE OF THE ERROR METRIC FOR EACH ONE OF THE READ LEVEL OFFSETS OF THE PRIMARY SET — 2002

READING THE MEMORY CELLS AT AN OPTIMUM READ LEVEL ASSOCIATED WITH THE ONE OF THE PLURALITY OF DATA STATES AND DETERMINED BASED ON ANALYSIS OF THE VALUE OF THE ERROR METRIC FOR EACH OF THE READ LEVEL OFFSETS OF BOTH THE PRIMARY SET AND THE SECONDARY SET — 2004

*FIG. 20*

BINARY SEARCH BIT ERROR RATE ESTIMATION SCAN FOR NON-VOLATILE MEMORY APPARATUS

CROSS-REFERENCE TO RELATED APPLICATIONS

This application claims the benefit of U.S. Provisional Application No. 63/429,648, filed on Dec. 2, 2022. The entire disclosure of the application referenced above is incorporated herein by reference.

FIELD

The present technology relates to the memory apparatuses and methods of operation of memory apparatuses.

BACKGROUND

Non-volatile data storage devices or apparatuses, such as embedded flash memories, universal serial bus (USB) flash memory devices, or removable storage cards, have allowed for increased portability of data and software applications. Flash memory devices can enhance data storage density by storing multiple bits in each flash memory cell. For example, Multi-Level Cell (MLC) flash memory devices can provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the particular flash memory cell may be programmed to a state (e.g., by setting a threshold voltage) that corresponds to the sequence of bits.

Once memory cells in a data storage device have been programmed, data may be read from the memory cells by sensing the programmed state of each memory cell by comparing the cell threshold voltage to one or more read voltages. However, the sensed programming states can sometimes vary from the written programmed states due to one or more factors, such as data retention and program disturb conditions. Accordingly, there is a need for improved non-volatile memory apparatuses and methods of operation.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide a memory apparatus including memory cells configured to retain a threshold voltage corresponding to one of a plurality of data states. A control means is coupled to the memory cells and is configured to, for each one of the plurality of data states, read the memory cells using a primary set of read level offsets from a default read level associated with one of the plurality of data states and determine a value of an error metric for each of the primary set of read level offsets. The control means additionally reads the memory cells using a secondary set of read level offsets from the default read level associated with the one of the plurality of data states and determine the value of the error metric for each of the secondary set of read level offsets. The secondary set of read level offsets is based on the value of the error metric for each one of the read level offsets of the primary set. The control means is also configured to read the memory cells at an optimum read level associated with the one of the plurality of data states and determined based on analysis of the value of the error metric for each of the read level offsets of both the primary set and the secondary set.

According to another aspect of the disclosure, a controller in communication with a memory apparatus including memory cells configured to retain a threshold voltage corresponding to one of a plurality of data states is also provided. The controller is configured, for each one of the plurality of data states, to instruct the memory apparatus to read the memory cells using a primary set of read level offsets from a default read level associated with one of the plurality of data states and determine a value of an error metric for each of the primary set of read level offsets. The controller is also configured to instruct the memory apparatus to read the memory cells using a secondary set of read level offsets from the default read level associated with the one of the plurality of data states and determine the value of the error metric for each of the secondary set of read level offsets, the secondary set of read level offsets based on the value of the error metric for each one of the read level offsets of the primary set. The controller is additionally configured to instruct the memory apparatus to read the memory cells at an optimum read level associated with the one of the plurality of data states and determined based on analysis of the value of the error metric for each of the read level offsets of both the primary set and the secondary set.

According to an additional aspect of the disclosure, a method of operating a memory apparatus is provided. The memory apparatus includes memory cells configured to retain a threshold voltage corresponding to one of a plurality of data states. The method includes the step of reading the memory cells using a primary set of read level offsets from a default read level associated with one of the plurality of data states and determine a value of an error metric for each of the primary set of read level offsets. The method continues with the step of reading the memory cells using a secondary set of read level offsets from the default read level associated with the one of the plurality of data states and determining the value of the error metric for each of the secondary set of read level offsets, the secondary set of read level offsets based on the value of the error metric for each one of the read level offsets of the primary set. The method also includes the step of reading the memory cells at an optimum read level associated with the one of the plurality of data states and determined based on analysis of the value of the error metric for each of the read level offsets of both the primary set and the secondary set.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 is a block diagram of a particular illustrative embodiment of a system including a data storage device configured to generate updated read voltages based on ECC related information of multiple representations of data resulting from holding a read voltage constant while adjusting another read voltage according to aspects of the disclosure;

FIG. 2 is a diagram of a particular embodiment of components of the data storage device of FIG. 1 configured to store storage element state data in a controller memory and to use the stored state data to emulate performing read operations according to aspects of the disclosure;

FIG. 3 is a flow chart of a particular embodiment of a method of updating read voltages that may be performed by the data storage device of FIG. 1 according to aspects of the disclosure;

FIG. 4 is a flow chart of another particular embodiment of a method of updating read voltages that may be performed by the data storage device of FIG. 1 according to aspects of the disclosure;

FIG. 5 is a flow chart of another particular embodiment of a method of updating read voltages that may be performed by the data storage device of FIG. 1 according to aspects of the disclosure;

FIG. 6 is a flow chart of another particular embodiment of a method of updating read voltages that may be performed by the data storage device of FIG. 1 according to aspects of the disclosure;

FIG. 7 is a flow chart of another particular embodiment of a method of updating read voltages that may be performed by the data storage device of FIG. 1 according to aspects of the disclosure;

FIG. 8 is a block diagram of another particular illustrative embodiment of a system including a data storage device configured to generate updated read voltages based on ECC related information of multiple representations of data according to aspects of the disclosure;

FIG. 9 is a block diagram illustrating a particular embodiment of a mapping converter that may be included in the data storage device of FIG. 1 or FIG. 8 according to aspects of the disclosure;

FIG. 10 is a block diagram illustrating a particular embodiment of a mapping checker that may be included in the data storage device of FIG. 1 or FIG. 8 according to aspects of the disclosure;

FIG. 11 is a diagram that illustrates a particular embodiment of components that may be included in the data storage device of FIG. 1 or FIG. 8 and also illustrates an example of interpolation and peak detection that may be applied to syndrome values by the data storage device of FIG. 1 or FIG. 8 according to aspects of the disclosure;

FIG. 12 is a flow chart of a particular embodiment of a method of updating read voltages that may be performed by the data storage device of FIG. 1 or FIG. 8 according to aspects of the disclosure;

Figure 18:
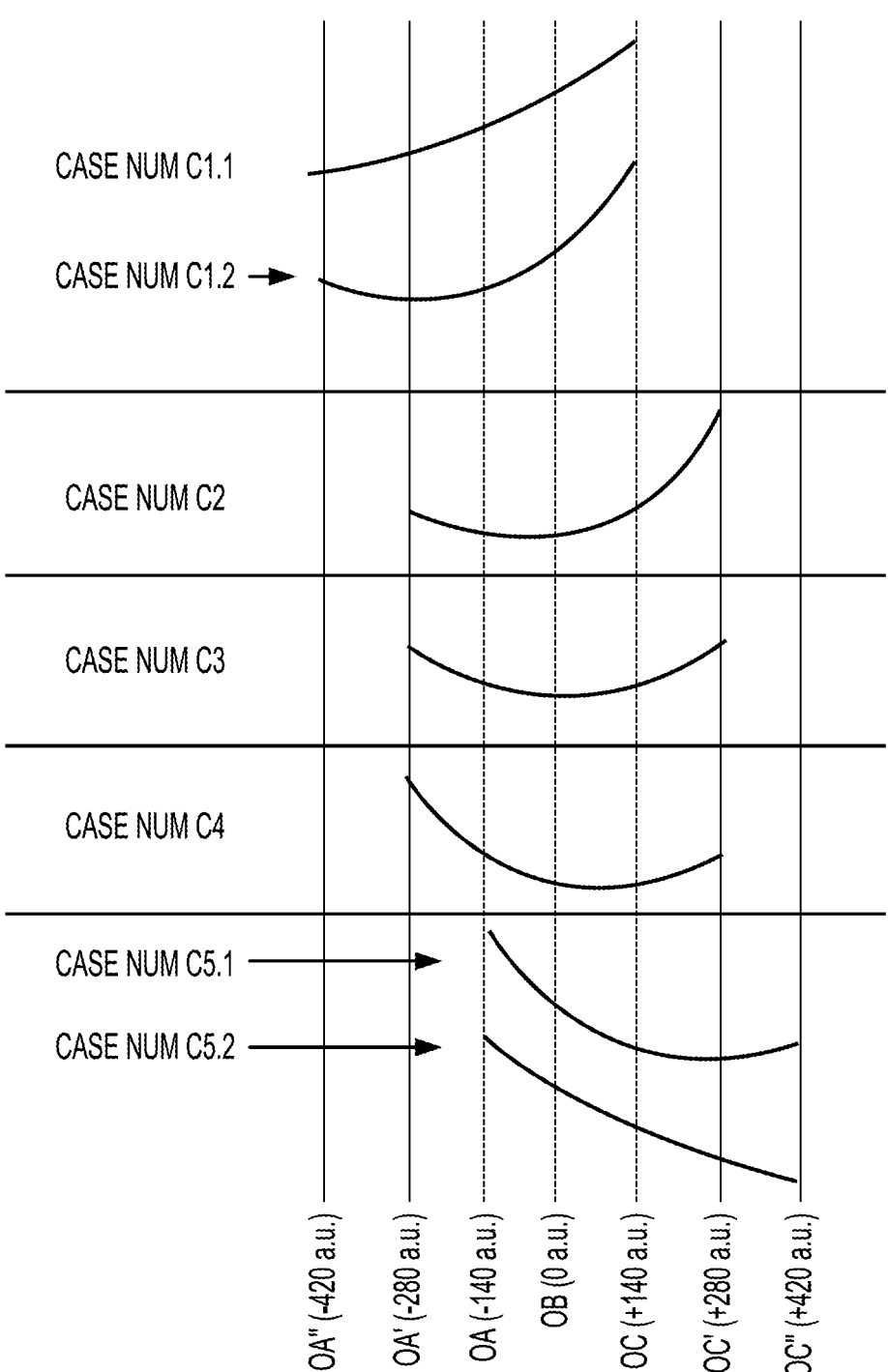

FIG. 17 lists the plurality of five point cases defined by relative magnitudes of the value of the error metric for the primary set of read level offsets and the secondary set of read level offsets along with the secondary set of read level offsets to be performed in the second stage for each of the plurality of five point cases according to aspects of the disclosure;

FIG. 18 shows plots of the relative magnitudes of the value of the error metric for the primary set of read level offsets and the secondary set of read level offsets for each of the plurality of five point cases according to aspects of the disclosure;

FIG. 19 lists the plurality of five point cases defined by relative magnitudes of the value of the error metric for the primary set of read level offsets and the secondary set of read level offsets along with additional read level offsets of the secondary set to be performed in the second stage for each of the plurality of five point cases according to aspects of the disclosure; and FIG. 20 illustrates steps of a method of operating a memory apparatus according to aspects of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side select gate SG transistors (SGD transistors), on a drain-side of the NAND string which is connected to a bit line, and one or more source-side select gate SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory cells can include data memory cells, which are eligible to store user data, and dummy or non-data memory cells which are ineligible to store user data.

Before programming certain non-volatile memory devices, the memory cells are typically erased. For some devices, the erase operation removes electrons from the floating gate of the memory cell being erased. Alternatively, the erase operation removes electrons from the charge-trapping layer.

A programming operation for a set of memory cells typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a data state (a programmed data state) different from the erased state. For example, in a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIGS. 1 and 8). In a four-bit per cell memory device, there are sixteen data states including the erased state and fifteen higher data states referred to as the Er, 1, 2, 3, 4, 5, 6, 7, 8, 9, A, B, C, D, E and F data states.

When a program command is issued, the write data is stored in latches associated with the memory cells. During programming, the latches of a memory cell can be read to determine the data state to which the cell is to be programmed. Each programmed data state is associated with a verify voltage such that a memory cell with a given data state is considered to have completed programming when a sensing operation determines its threshold voltage (Vth) is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

Due to data retention issues, the threshold voltage (Vt) of non-volatile storage elements may shift. Therefore, the read level (CGRV) should be changed/updated to reflect the Vt shift. One technique for finding a new read level is to read the memory cells at a number of different read levels for a particular data state and count errors that arise in the data or bits stored. Then, based on the count of the errors at each read level, the read level for that particular data state can be adjusted. The process of determining the count may be referred to herein as a "scan." Performing the scan to determine the adjusted read level can be time consuming due to the number of reads, as well as the time needed for each read.

Referring to FIG. 1, a particular embodiment of a system 100 includes a data storage device 102 coupled to an accessing device such as a host device 130. The data storage device 102 is configured to generate an updated set of read voltages 146 based on ECC related information of multiple representations of data. The multiple representations of data result from adjusting a read voltage while holding another read voltage constant to read the data from a non-volatile memory 104.

The host device 130 may be configured to provide data, such as user data 132, to be stored at the non-volatile memory 104 or to request data to be read from the non-volatile memory 104. For example, the host device 130 may include a mobile telephone, a music player, a video player, a gaming console, an electronic book reader, a personal digital assistant (PDA), a computer, such as a laptop computer, notebook computer, or tablet, any other electronic device, or any combination thereof. The host device 130 communicates via a memory interface that enables reading from the non-volatile memory 104 and writing to the non-volatile memory 104. For example, the host device 130 may operate in compliance with a Joint Electron Devices Engineering Council (JEDEC) industry specification, such as a Universal Flash Storage (UFS) Host Controller Interface specification. As other examples, the host device 130 may operate in compliance with one or more other specifications, such as a Secure Digital (SD) Host Controller specification as an illustrative example. The host device 130 may communicate with the non-volatile memory 104 in accordance with any other suitable communication protocol.

The data storage device 102 includes the non-volatile memory 104 coupled to a controller 120. For example, the non-volatile memory 104 may be a NAND flash memory. The non-volatile memory 104 includes a representative group 106 of storage elements, such as a word line of a multi-level cell (MLC) flash memory. The group 106 includes a representative storage element 108, such as a flash MLC cell. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The controller 120 is configured to receive data and instructions from and to send data to the host device 130. The controller 120 is further configured to send data and commands to the non-volatile memory 104 and to receive data from the non-volatile memory 104. For example, the controller 120 is configured to send data and a write command to instruct the non-volatile memory 104 to store the data to a specified address. As another example, the controller 120 is configured to send a read command to the non-volatile memory 104.

The controller 120 includes an ECC engine 122 that is configured to receive data to be stored to the memory 104 and to generate a codeword. For example, the ECC engine 122 may include an encoder 124 configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 122 may include a decoder 126 configured to decode data read from the memory 104 to detect and correct, up to an error correction capability of the ECC scheme, any bit errors that may be present in the data.

The controller 120 includes a read voltage update engine 140 that is configured to generate the updated set of read voltages 146 based on ECC related information received from the decoder 126. To illustrate, a first graph 190 shows a histogram or distribution of storage element threshold values having clusters representing states Erase (Er), A, B, C, D, E, F, and G, in a 3-bit per cell (3BPC) multi-level cell (MLC) implementation. A set of read voltages VA, VB, VC, VD, VE, VF, and VG define boundaries between the states and may be used to determine a state of a storage element. For example, applying the read voltage VA to a word line of the group 106 activates storage elements having threshold voltages less than VA while storage elements having threshold voltages greater than VA are not activated.

Some storage elements originally set to the Er state may experience a threshold voltage shift that causes the threshold voltages of the storage elements to be greater than VA. Reading these storage elements using VA results in bit errors because the storage elements are read as having a "110" value (corresponding to state A) rather than having a "111" value (corresponding to the Er state). Similarly, some storage elements originally programmed to state A may experience a threshold voltage shift that causes the threshold voltages of the storage elements to be less than VA. Reading these storage elements using VA also results in bit errors because the storage elements are read as having a "111" value rather than having a "110" value.

The read voltage update engine 140 may be configured to adjust VA, such as by sequentially assigning VA to a first trial value 191, a second trial value 192, a third trial value 193, a fourth trial value 194, and a fifth trial value 195, without adjusting the other read voltages VB-VG. Each resulting set of read voltages may be used to read the data from the group 106, and the resulting data may be decoded by the decoder 126. ECC related information from the decoder 126 may be used to select one of the trial values 191-195 that results in a lowest estimated or actual number of bit errors in the data (as compared to the estimated or actual number of bit errors corresponding to the other trial values 191-195). Another example may include an SLC memory with only two states (Er and A), and the adjusting of VA in this case may be performed by sequentially assigning VA to a first trial value 191, a second trial value 192, a third trial value 193, a fourth trial value 194, and a fifth trial value 195. Each resulting set of read voltages may be used to read the data from the group 106, and the resulting data may be decoded by the decoder 126. ECC related information from the decoder 126 may be used to select one of the trial values 191-195 that results in a lowest estimated or actual number of bit errors in the data (as compared to the estimated or actual number of bit errors corresponding to the other trial values 191-195). More generally, the ECC related information may be used to select one of the trial values that results in a minimal (or maximal) detected value of an ECC related metric corresponding to the ECC related information. For example, an objective may be to determine a read threshold which minimizes the bit error rate. As another example, an objective may be to minimize ECC power, latency, throughput, or any other ECC related metric. Also it is not necessary to decode the codewords for determining an "optimal" read voltage. Other ECC related information may be used without fully decoding (e.g. computing the number of unsatisfied ECC parity-check equations, also known as syndrome weight, without full decoding, or BER estimation without decoding, as non-limiting examples).

After selecting one of the trial values for VA, the read voltage update engine 140 may select another read voltage to adjust. A second graph 196 illustrates multiple trial values of VE that may each be used to read the data from the group 106. The resulting data may be decoded at the decoder 126 and a trial value selected for VE based on comparisons of actual or estimated errors. Each read voltage of the updated set of read voltages 146 may be updated by the read voltage update engine 140 in a similar manner as described with respect to VA.

During operation, a determination may be made to perform a read voltage update. The determination to perform a read voltage update may be based on a total number of write/erase (W/E) cycles at the non-volatile memory 104 exceeding a W/E threshold, the time that elapsed since the block including the group of storage elements 106 has been programmed (or any other indication or metric that is correlated to the time) exceeding a threshold, a number of read operations in a block that includes the group 106 exceeding a read threshold, or an average number of errors detected by the decoder 126 exceeding an error threshold, as illustrative, non-limiting examples.

The read voltage update engine 140 may select one or more read voltages for adjustment in a first iteration of a read voltage update process. The group 106 may store data in a page-by-page, non-interleaved manner, such that a first ECC codeword is stored in a first logical page of a physical page of the group 106 (e.g., a 'lower' page corresponding to the least significant bit stored in each storage element of the physical page). A second ECC codeword may be stored in a second logical page of the physical page (e.g., a 'middle' page corresponding to the middle bit stored in each storage element of the physical page). A third ECC codeword may be stored in a third logical page of the physical page (e.g., an 'upper' page corresponding to the most significant bit stored in each storage element of the physical page).

As illustrated in the first graph 190, VA may be selected as a first read voltage to be adjusted. As illustrated in the second graph 196, VE may be selected as a second read voltage to be adjusted. Because the lower page bit value stored in a storage element is "1" for storage elements in state Er and in states E, F, and G and is "O" for storage elements in states A, B, C and D, the lower page can be read by performing sense operations at the Er-A boundary (VA) and at the D-E boundary (VE).

The read voltage update engine 140 may select the first trial value 191 and may generate a first set of read voltages 170 for determining the first read voltage (VA). The first set of read voltages 170 may be represented as the set {first trial value 191, VE}. A first representation 180 of data may be read from the group 106 using the first set of read voltages 170 and received at the controller 120. The first representation 180 may be provided to the decoder 126.

The read voltage update engine 140 may select the second trial value 192 and generate a second set of read voltages for determining the first read voltage (VA). The second set of read voltages may be represented as {second trial value 192, VE}. The read voltage update engine 140 may also generate a third set of read voltages {third trial value 193, VE}, a fourth set of read voltages {fourth trial value 194, VE}, up to an Nth set of read voltages 172 of {fifth trial value 195, VE} (e.g., N=5) for determining the first read voltage. Each generated set of read voltages 170-172 may be sent to the non-volatile memory 104 and used to read a corresponding representation 180-182 that is provided to the decoder 126.

The decoder 126 may generate first ECC related information 142 responsive to the multiple representations 180-182. The ECC related information may also be generated by a separate designated ECC related function (e.g., a separate hardware engine) and not necessarily by the ECC decoder 106. The read voltage update engine 140 may receive or otherwise access the first ECC related information 142 to determine or estimate a number of errors or a bit error rate (BER) for each of the representations 180-182. Alternatively, or in addition, the read voltage update engine 140 may determine any other ECC related metric.

To illustrate, when the decoder 126 fully decodes each of the representations 180-182, the decoder 126 may generate information including a number of corrected errors. The read voltage update engine 140 may compare the number of corrected errors resulting from reading the data with each of the sets 170-172 to select the particular set 170-172 having the lowest identified number of corrected errors of the sets 170-172. The trial value of VA for the selected set (e.g., third trial value 193) may be used as an updated value of VA.

In other implementations, latency associated with fully decoding each of the representations 180-182 may be avoided by estimating a bit error rate (BER) or number of errors without fully decoding the representations 180-182. For example, the decoder 126 may generate a syndrome value indicating a number of parity check equations that are unsatisfied for each of the representations 180-182. The syndrome for each of the representations 180-182 generally indicates a relative amount of errors in each of the corresponding representations 180-182. The syndrome may be generated using dedicated hardware circuitry with reduced latency as compared to full decoding. The first ECC related information 142 may include syndrome values for each of the representations 180-182 and the read voltage update engine 140 may search and/or sort the syndromes to identify a lowest estimated BER of the representations 180-182 and to select a corresponding trial value of VA.

As another example, a length of time corresponding to a decoding operation may be used to estimate a number of errors or BER. To illustrate, representations of data having a greater number of errors may generally require longer decoding (e.g., more iterations for convergence, longer error location search processing, etc.) than representations of data having fewer errors. The decoder 126 may be configured to fully decode a first representation of data and to store the decoding time for the first representation. For each subsequent representation of data, the decoder 126 may terminate decoding if the decoding time exceeds the stored decoding time, or may update the stored decoding time if the decoding time is less than the stored decoding time. The first ECC related information 142 may indicate one or more decoding times or relative decoding times of the representations 180-182 to enable the read voltage update engine 140 to identify a shortest of the decoding times of the representations 180-182 and to select a corresponding trial value of VA.

As another example, a number of bit values that change during a decoding operation may be used to estimate a number of errors or BER. To illustrate, during an iterative decoding process, representations of data having a greater number of errors may experience more "bit flips" prior to convergence than representations of data having a lesser number of errors. The decoder 126 may be configured to track a number of bit flips for each representation 180-182 and to indicate resulting counts of bit flips in the first ECC related information 142 to enable the read voltage update engine 140 to identify a lowest count of bit flips of the representations 180-182 and to select a corresponding trial value of VA.

As another example, at least a portion of the data stored in the group 106 may be reference data. The portion of each of the representations 180-182 that corresponds to the reference data may be compared to the reference data to identify errors. For example, the decoder 126 may include circuitry configured to compare a portion of each representation 180-182 to the reference data and to generate a count of detected bit errors. The resulting counts may be provided in the first ECC related information 142 to enable the read voltage update engine 140 to identify a lowest of the counts of reference data errors of the representations 180-182 and to select a corresponding trial value of VA.

After selection of a trial value of VA (e.g., the third trial value 193), the read voltage update engine 140 may select a first trial value 161 of VE, as illustrated in the second graph 196, and may generate a first set of read voltages 174 for determining the second read voltage (VE). The first set of read voltages 174 may be represented as the set {third trial value 193, first trial value 161 of VE}. A first representation 184 of data may be read from the group 106 using the first set of read voltages 174 and received at the controller 120. The first representation 184 may be provided to the decoder 126.

The read voltage update engine 140 may select a second trial value 162 of VE and generate a second set of read voltages for determining VE. The second set of read voltages may be represented as {third trial value 193, second trial value 162 of VE}. The read voltage update engine 140 may also generate a third set of read voltages {third trial value 193, third trial value 163 of VE}, a fourth set of read voltages {third trial value 193, fourth trial value 164 of VE}, up to an Nth set of read voltages 176 of {third trial value 193, fifth trial value 165 of VE} (e.g., N=5) for determining VE. Each generated set of read voltages 174-176 may be sent to the non-volatile memory 104 and used to read a corresponding representation 184-186 that is provided to the decoder 126.

The decoder 126 (or a separate designated ECC related function) may generate second ECC related information 144 for each of the representations 184-186 that is provided to or accessible to the read voltage update engine 140. As described with respect to the first ECC related information 142, the second ECC related information 144 may include one or more counts of corrected errors, syndrome values, indications of decoding times, counts of changed bit values, or indications of similarity to reference data, as illustrative, non-limiting examples. The second ECC related information 144 enables the read voltage update engine 140 to select a trial value of VE (e.g., the third trial value 163 of VE) that reduces an actual or estimated number of errors or BER.

The read voltage update engine 140 may update the values of VA and VE in the updated set of read voltages 146 after selecting trial versions of VA and VE as described above. However, in other implementations, the read voltage update engine 140 may repeat the VA, VE selection process by selecting a next value of VA using trial values of VA with the selected value of VE and selecting a next value of VE using the most recently selected value of VA with trial values of VE. The process may be repeated iteratively until a convergence criterion is achieved. For example, the convergence criterion may be achieved when an estimated BER does not decrease between successive iterations of the VA, VE selection process.

The other read voltages may be updated in a manner similar to VA and VE. For example, the upper page may be read using VC and VG. The group 106 may be read using trial values of VC while holding VG constant, followed by adjusting VG while holding VC constant. As another example, the middle page may be read using VB, VD, and VF. The group 106 may be read using trial values of VB while holding VD and VF constant, followed by adjusting VD while holding VB and VF constant, followed by adjusting VF while holding VB and VD constant.

By adjusting a selected read voltage while holding other read voltages constant, changes in error counts or BERs (actual or estimated) or any other ECC related metric (such as latency, throughput, power, etc.) resulting from changes in the selected read voltage may be identified and an "optimal" value of each of the read voltages associated with the fewest errors (or lowest decoding latency, or lowest decoding power, etc.) may be selected.

Although the non-volatile memory 104 is described as a three bits per storage element (3BPC) MLC, in other implementations the non-volatile memory 104 may store a single bit per storage element (SLC), two bits per storage element (2BPC), four bits per storage element (4BPC), or any other number of bits per storage element. Although in the examples described above, five trial values of each read voltage are illustrated (e.g., N=5), in other implementations a number of trial values may be less than five or more than five.

Although the group 106 is described as storing multiple codewords in a page-by-page, non-interleaved manner, in other implementations one or more ECC codewords may be interleaved across multiple logical pages. Reading multiple (or all) of the logical pages of a physical page may include performing sense operations using all of the read voltages VA-VG, rather than using a reduced set corresponding to a single logical page, to read a single codeword from the group 106. Each read voltage may be individually varied and a trial value selected based on ECC related information for the single ECC codeword.

In other implementations, a number of sensing operations may be reduced and an amount of time to complete selection of read voltages may be reduced by storing data at the controller 120 (e.g., in a memory 152, such as a random access memory (RAM) in the controller 120 or a memory accessible to the controller 120) that corresponds to data read from the non-volatile memory 104 that corresponds to a particular read voltage.

For example, as illustrated in the first graph 190, reading the lower page includes sensing at VA and VE. Conventionally, reading the lower page of the group 106 may include first sensing the group 106 using VA and storing the first sensing results in a latch at the non-volatile memory 104. Next, the group 106 may be sensed using VE and second sensing results may be stored in another latch at the non-volatile memory 104. The first sensing results (e.g., "D1") and the second sensing results (e.g., "D2") may be combined using a bit-wise logical operation, such as NOT (D1 XOR D2), where NOT indicates a logical inverse operation and XOR indicates an exclusive-OR operation.

However, when adjusting VA while VE is held constant, the second sensing results (D2) do not change. These results may be stored in the latch at the non-volatile memory 104 or at the memory 152 and combined with the first sensing results for each trial value of VA, reducing a total number of sensing operations that are performed.

Table 1 illustrates, for each of the states Er-G, a first row of values that result from sensing using VA (e.g., D1), a second row of values that result from sensing using VE (e.g., D2), and a third row of results of a NOT-XOR operation of the first row and the second row that corresponds to a lower page reading. The values in the third row are logically equivalent to the results attained by reading the lower page of the group 106. An implementation of updating read voltages may include reading at VE once (to generate the second row of Table 1) and storing results of the reading (e.g. at a latch of the non-volatile memory, or at a memory of the controller (e.g. RAM 152). An additional reading of the group 106 may be performed using VA only (i.e., without sensing using VE) to generate the first row of Table 1. A NOT-XOR operation may be performed to generate data corresponding to the third row of Table 1 for each storage element in the group 106. The results of the NOT-XOR corresponding to lower page reads at multiple VA values and at a fixed VE value may be stored in a latch in the non-volatile memory 104 or in the memory 152, as illustrative examples.

TABLE 1

| | Er | A | B | C | D | E | F | G |
|---|---|---|---|---|---|---|---|---|
| Sense at VA = <br> Sense between Er-A | 1 | 0 | 0 | 0 | 0 | 0 | 0 | 0 |
| Sense at VE = <br> Sense between D-E | 1 | 1 | 1 | 1 | 1 | 0 | 0 | 0 |
| NOT-XOR the two reads = <br> Lower Page read | 1 | 0 | 0 | 0 | 0 | 1 | 1 | 1 |

The group 106 may be sensed using various trial values of VA (e.g., the trial values 191-195) and a NOT-XOR operation of each sensing result and the stored data may be performed to generate a lower page read result for each trial value of VA. As a result, each of the representations 180-182 may be generated without repeating the VE sense operation for each of the representations 180-182. The representations 180-182 may be provided to the decoder 126 to generate the first ECC related information 142 to be processed by the read voltage update engine 140.

In some implementations, selection of read voltages may be performed using a "coarse" phase using a first voltage difference between trial values (e.g., a first step size) to select a "coarse" value for one or more read voltages. The coarse phase may be followed by a "fine" phase using a second voltage difference between trial values (e.g., a second step size smaller than the first step size). The fine phase may include performing a scan of trial values around the coarse value that is selected during the coarse phase.

In some implementations, selection of read voltages may be performed using another two-phase process, where an initial set of read thresholds are determined during the first phase. For example, the initial set of read thresholds may be determined by finding local minima of a cell voltage distribution (CVD). To illustrate, lowest points between each of the nodes of the first graph 190 may be determined to select an initial set of read voltages. A second phase following the first phase may include generating multiple trial sets of read voltages and selecting a trial value of a particular read voltage based on ECC related information, such as described with respect to the read voltage update engine 140.

FIG. 2 illustrates another embodiment of updating read voltages that may be performed by the data storage device 102 of FIG. 1 and includes a graphical depiction 202 of cell distributions for states (Er, A, . . . G), read voltages (e.g., voltages VA, VB, . . . VG), and candidate read voltages (e.g., trial values) for read voltages (e.g., voltages VA−2ΔR, VA−ΔR, VA, VA+ΔR, VA+2ΔR). To illustrate, the first trial value 191 of FIG. 1 may correspond to the candidate voltage VA−2ΔR, the second trial value 192 may correspond to the candidate voltage VA−ΔR, and the third trial value 193 may correspond to the candidate voltage VA, etc. A first table 204 illustrates a mapping of each voltage interval between adjacent trial read voltages to a set of six bits.

A read voltage update process may include reading a group of storage elements (e.g., the group 106 of FIG. 1) one time using each of the multiple (e.g., 35) trial read values (e.g., five trial values for each of seven read voltages). A result of the sensing may be encoded as illustrated in the first table 204 and stored in the memory 152 of FIG. 1 as a table 210 including a 6-bit value for each storage element that is sensed (e.g., to occupy six pages of RAM). To illustrate, the entry in the table 210 for the storage element having index 0 has a value "111001", corresponding to a threshold voltage in the voltage range between VA−ΔR and VA. The 6-bit value may be used to emulate a result of sensing the storage element at any of the 35 candidate voltages. For example, the storage element with index 0 has a "1" value for candidate voltages that are less than or equal to VA−ΔR and has a "0" value for candidate voltages that are greater than or equal to VA.

Rather than reading the non-volatile memory 104 of FIG. 1 with multiple sets of read voltages, such as the sets 170-172, the read voltage update engine 140 may access the table 210 to generate multiple representations of data that emulate results of reading storage elements using different combinations of candidate reading voltages. The representations of data may be selected and provided to the ECC engine 122 to produce ECC related information, and the ECC related information may be evaluated to select candidate voltages corresponding to lowered actual or estimated errors or BER, as described with respect to FIG. 1.

To illustrate, if the 6 bit read value (corresponding to the table 210) of a storage element having index 0 is 111001, then an emulated reading using a first set of read voltages {VA−2ΔR, VE} or a second set of read voltages {VA−ΔR, VE} results in a representation of stored data having a first bit sequence beginning with '0' that may be provided to the ECC engine 122 to generate first ECC related information. An emulated reading of the same storage element using a third set of read voltages {VA, VE} results in a second bit sequence beginning with '1' that may be provided to the ECC engine 122 to generate second ECC related information. The fifth storage element (having index 4) has a changed value as compared to the first bit sequence because the 6-bit value "111101" in the table 210 indicates that a threshold voltage for the fifth storage element is between VA−2ΔR and VA−ΔR. Therefore an emulated reading of this storage element using the first set of read voltages {VA−2ΔR, VE} results in a third bit sequence beginning with '0', but reading with the second set of read voltages {VA−ΔR, VE} results in a third bit sequence beginning with '1' that may be provided to the ECC engine 122.

By storing the sensing information in the memory 152 (e.g., in the table 210), a number of sensing operations may be reduced as compared to embodiments that perform sensing of storage elements for every trial set of read voltages. An amount of data transferred from the non-volatile memory 104 to the controller 120 may also be reduced as compared to embodiments where multiple representations of data are read from the non-volatile memory 104 for every read voltage. Estimating an error count or BER may be performed digitally in the controller 120 at relatively high speed and low power as compared to sensing operations and data transfer at the non-volatile memory 104. The controller 120 may include dedicated hardware circuitry to perform a portion or all of the read voltage update process as described with respect to FIG. 2.

To summarize, in an embodiment, a three step procedure may be performed. A first step may involve reading the group of storage elements 106 (requiring a minimal number of sensing operations) and transferring the read results to the controller memory 152 (requiring a minimal number of page transfers). In a second step dedicated hardware circuitry may read the internal controller memory 152 to generate (e.g., sequentially) for each of the multiple candidate read thresholds an emulated read result on which it will compute the ECC related information or metric. The second step may be performed solely within the controller, at high speed as compared to performing multiple read operations to generate the read results. In a third step, the best candidate read thresholds may be selected based on the ECC related information or metrics generated during the second step, such as selected as to minimize (or maximize) the ECC related metric.

FIG. 3 depicts an embodiment of a method 300 of updating a set of read voltages. The method 300 may be performed in a data storage device including a controller and a non-volatile memory, such as the data storage device 102 of FIG. 1.

The method 300 includes iteratively adjusting a first read voltage without adjusting a second read voltage to form first sets of read voltages, at 302. For example, the read voltage update engine 140 may adjust the read voltage VA to have the multiple trial values 191-195 to form the sets 170-172 of read voltages. As another example, iteratively adjusting the first read voltage may include generating first values of the first read voltage according to a first step size and, after identifying one of the first values based on a portion of the first ECC related information corresponding to the first values, generating a second set of values of the first read voltage according to a second step size that is smaller than the first step size.

Multiple first representations of data are read from the non-volatile memory according to the first sets of read voltages, at 304. For example, the multiple first representations of the data may include the representations 180-182 corresponding to the sets 170-172 of read voltages of FIG.

1. To illustrate, the first representation 180 may correspond to reading the group 106 using the first set 170, and the Nth representation 182 may correspond to reading the group 106 using the Nth set 172 of read voltages.

A first value of the first read voltage is selected based on first ECC related information from an error correction coding (ECC) decoder, at 306. The first ECC related information is responsive to the multiple first representations of the data. For example, the first ECC related information may correspond to the first ECC related information 142 of FIG. 1. As an example, the first ECC related information may correspond to a count of errors detected by the ECC decoder. As another example, the first ECC related information may correspond to a syndrome value (that may be generated by an ECC decoder or may be generated by other components (e.g., dedicated circuitry) other than an ECC decoder). As another example, the first ECC related information may correspond to a length of time of a decoding operation. As another example, the first ECC related information may correspond to a count of bit values that change during a decoding operation. As another example, the first ECC related information may correspond to a similarity of reference data to each of the multiple first representations of the data (e.g., based on counts of differences, or bit errors, between the first representations and the reference data).

The second read voltage is iteratively adjusted without adjusting the first read voltage to form second sets of read voltages, at 308. For example, the read voltage update engine 140 may adjust the read voltage VE to have the multiple trial values illustrated in the second graph 192 of FIG. 1 to form the sets 174-176 of read voltages.

Multiple second representations of the data from the non-volatile memory are read according to the second sets of read voltages, at 310. For example, the multiple second representations of the data may include the representations 184-186 corresponding to the sets 174-176 of read voltages of FIG. 1. To illustrate, the first representation 184 may correspond to reading the group 106 using the first set 174, and the Nth representation 186 may correspond to reading the group 106 using the Nth set 176 of read voltages.

A second value of the second read voltage is selected based on second ECC related information from the ECC decoder, at 312. The second ECC related information responsive to the multiple second representations of the data. For example, the second ECC related information may correspond to the second ECC related information 144 of FIG. 1.

An updated set of the read voltages that includes the first value and the second value is stored, at 314. For example, the updated set of the read voltages may correspond to the updated set 146 of FIG. 1.

The method 300 may further include determining whether a convergence condition has been satisfied by comparing the first ECC related information to the second ECC related information. For example, the convergence criterion may correspond to determining whether a count of errors or BER (actual or estimated) decreased for the second read voltage as compared to the count of errors or BER for the first read voltage. The convergence criterion may be satisfied when no reduction in errors or BER occurs as a result of updating a read voltage, and updating of the read voltages may end. In response to determining that the convergence condition has not been satisfied, a second updated set of the read voltages may be based on third ECC related information resulting from representations of the data according to third sets of the read voltages with varying values of the first read voltage. For example, when the convergence criterion has not been satisfied (e.g., the count of errors or BER after selecting the second value of the second read voltage at 312 is less than the count of errors or BER after selecting the first value of the first read voltage at 308), processing may return to 302 where a next sets of read voltages are generated.

FIG. 4 depicts an embodiment of a method 400 of updating a set of read voltages. The method 400 may be performed in a data storage device including a controller and a non-volatile memory, such as the data storage device 102 of FIG. 1.

The method 400 includes iteratively adjusting a first read voltage of a set of read voltages and reading multiple first representations of first partial data from a logical page of the non-volatile memory, at 402. Each of the first representations of the first partial data is read according to a corresponding value of the first read voltage. For example, the first representations may correspond to sensing the group 106 using different trial values 191-195 of the read voltage VA without also sensing the group 106 using the read voltage VE.

Multiple first representations of data corresponding to the logical page are generated by combining each of the first representations of first partial data with second partial data, at 404. For example, data corresponding to sending the group 106 may be stored and combined with each of the first representations, such as via a NOT-XOR operation as described with respect to Table 1.

A value of the first read voltage is selected based on first ECC related information, at 406. The first ECC related information is responsive to the multiple first representations of the data. For example, the first ECC related information may correspond to the first ECC related information 142 of FIG. 1.

After determining the second partial data, generating the multiple representations may be performed using fewer sense operations as compared to the method 300 of FIG. 3. For example, a first representation of the data may be from the logical page of the non-volatile memory using a first value of the first read voltage and a second read voltage (e.g., using VA and VE). A second representation of the partial data may be read from the first logical page using the first value of the first read voltage without using the second read voltage (e.g., sensing only using VA and not using VE). The second partial data of the logical page may be generated by applying a logical operation to the first representation and to the first partial data, such as the NOT-XOR operation described with respect to Table 1. A reduced number of sensing operations may reduce a time to complete updating the read voltages.

FIG. 5 depicts an embodiment of a method 500 of updating a set of read voltages. The method 500 may be performed in a data storage device including a controller and a non-volatile memory, such as the data storage device 102 of FIG. 1.

The method 500 includes generating a set of read voltages based on detecting valleys in a cell voltage distribution (CVD), at 502. The CVD corresponds to a group of storage elements of the non-volatile memory. For example, the valleys may correspond to local minima in the first graph 190 of FIG. 1.

A first read voltage of the set of read voltages is iteratively adjusted without adjusting a second read voltage of the set of read voltages to form first sets of read voltages, at 504. For example, the read voltage update engine 140 may adjust the read voltage VA to have the multiple trial values 191-195 to form the sets 170-172 of read voltages. As another example, iteratively adjusting the first read voltage may include generating first values of the first read voltage according to a first step size and, after identifying one of the first values based on a portion of the first ECC related information corresponding to the first values, generating a second set of values of the first read voltage according to a second step size that is smaller than the first step size.

Multiple first representations of data are read from the group of storage elements according to the first sets of read voltages, at 506. For example, the multiple first representations of the data may include the representations 180-182 corresponding to the sets 170-172 of read voltages of FIG. 1. To illustrate, the first representation 180 may correspond to reading the group 106 using the first set 170, and the Nth representation 182 may correspond to reading the group 106 using the Nth set 172 of read voltages.

A first value of the first read voltage is selected based on first ECC related information from an error correction coding (ECC) decoder, at 508. The first ECC related information is responsive to the multiple first representations of the data. For example, the first ECC related information may correspond to the first ECC related information 142 of FIG. 1. As an example, the first ECC related information may correspond to a count of errors detected by the ECC decoder. As another example, the first ECC related information may correspond to a syndrome value. As another example, the first ECC related information may correspond to a length of time of a decoding operation. As another example, the first ECC related information may correspond to a count of bit values that change during a decoding operation. As another example, the first ECC related information may correspond to a similarity of reference data to each of the multiple first representations of the data (e.g., based on counts of differences, or bit errors, between the first representations and the reference data).

The second read voltage is iteratively adjusted without adjusting the first read voltage to form second sets of read voltages, at 510. For example, the read voltage update engine 140 may adjust the read voltage VE to have the multiple trial values illustrated in the second graph 192 of FIG. 1 to form the sets 174-176 of read voltages.

Multiple second representations of the data are read from the group of storage elements according to the second sets of read voltages, at 512. For example, the multiple second representations of the data may include the representations 184-186 corresponding to the sets 174-176 of read voltages of FIG. 1. To illustrate, the first representation 184 may correspond to reading the group 106 using the first set 174, and the Nth representation 186 may correspond to reading the group 106 using the Nth set 176 of read voltages.

A second value of the second read voltage is selected based on second ECC related information from the ECC decoder, at 514. The second ECC related information is responsive to the multiple second representations of the data. For example, the second ECC related information may correspond to the second ECC related information 144 of FIG. 1.

An updated set of the read voltages that includes the first value and the second value is stored, at 516. For example, the updated set of the read voltages may correspond to the updated set 146 of FIG. 1.

The method 500 may further include determining whether a convergence condition has been satisfied by comparing the first ECC related information to the second ECC related information. For example, the convergence criterion may correspond to determining whether a count of errors or BER (actual or estimated) decreased for the second read voltage as compared to the count of errors or BER for the first read voltage. The convergence criterion may be satisfied when no reduction in errors or BER occurs as a result of updating a read voltage, and updating of the read voltages may end. In response to determining that the convergence condition has not been satisfied, a second updated set of the read voltages may be based on third ECC related information resulting from representations of the data according to third sets of the read voltages with varying values of the first read voltage. For example, when the convergence criterion has not been satisfied (e.g., the count of errors or BER after selecting the second value of the second read voltage at 312 is less than the count of errors or BER after selecting the first value of the first read voltage at 308), processing may return to 302 where a next sets of read voltages are generated.

FIG. 6 depicts an embodiment of a method 600 of updating a set of read voltages. The method 600 may be performed in a data storage device including a controller and a non-volatile memory, such as the data storage device 102 of FIG. 1.

Multiple storage elements of the non-volatile memory are sensed using a set of candidate read voltages to generate sensing data, at 602. The set of candidate read voltages includes a first group of candidate read voltages corresponding to a first read voltage and a second group of candidate read voltages corresponding to a second read voltage. For example the group 106 of storage elements of FIG. 1 may be sensed according to the candidate voltages illustrated in the graphical depiction 200 of FIG. 2.

The sensing data is stored in a memory that is accessible to the controller, at 604. For example, the sensing data may be stored in the memory 152, such as a controller RAM.

Multiple representations of data stored in the group of storage elements are generated based on the sensing data, at 606. Each of the multiple representations of the data emulates results of reading the storage elements using a different combination of candidate reading voltages. For example, the multiple representations of the data may include the emulated readings at various candidate voltages for VA (and a constant value of VE) as illustrated in FIG. 2.

Values of the first read voltage and the second read voltage are selected based on ECC related information from an error correction coding (ECC) decoder, at 608. The ECC related information is responsive to the multiple representations of the data. For example, the ECC related information may correspond to the first ECC related information 142 of FIG. 1.

The sensing data may be stored according to a table having a multi-bit value corresponding to each of the storage elements, each of the multi-bit values corresponding to a distinct threshold voltage region. For example, the table 210 of FIG. 2 illustrates a 6-bit value for each storage element indicating a threshold voltage region for each storage element, such as the value "111101" for the storage element with index 4, indicating a threshold voltage in voltage region extending from VA−2ΔR to VA−ΔR.

The sensing data may be transferred from the non-volatile memory to the controller a single time. For example, the memory 152 may be a controller random access memory (RAM) as illustrated in FIG. 1. By performing a single sensing at each of the candidate voltages and a single transfer of the sensing data to the controller, an amount of data to be transferred between the non-volatile memory and the controller, and an amount of time to perform read voltage updates, may be reduced as compared to the method 300 of FIG. 3.

FIG. 7 depicts an embodiment of a method 700 of updating a set of read voltages. The method 700 may be performed in a data storage device including a controller and a non-volatile memory, such as the data storage device 102 of FIG. 1.

The method 700 includes iteratively adjusting a read voltage to form sets of read voltages, at 702. For example, the read voltage update engine 140 may adjust the read voltage VA to have the multiple trial values 191-195 to form the sets 170-172 of read voltages. As another example, in an SLC implementation, a single read voltage VA may be used and each set of read voltages may include a distinct trial value of VA.

Multiple representations of data are read from the non-volatile memory according to the sets of read voltages, at 704. For example, the multiple representations of the data may include the representations 180-182 corresponding to the sets 170-172 of read voltages of FIG. 1. To illustrate, the first representation 180 may correspond to reading the group 106 using the first set 170, and the Nth representation 182 may correspond to reading the group 106 using the Nth set 172 of read voltages.

A value of the read voltage is selected based on ECC processing information, at 706. The ECC processing information is responsive to the multiple representations of the data. The ECC processing information may be acquired without fully decoding, or prior to fully decoding, all of the multiple representations of the data. As an example, the ECC processing information may correspond to a syndrome value (that may be generated by an ECC decoder or may be generated by other components (e.g., dedicated circuitry) other than an ECC decoder). As another example, the ECC processing information may correspond to a length of time of a decoding operation. As another example, the ECC processing information may correspond to a count of bit values that change during a decoding operation. As another example, the ECC processing information may correspond to a similarity of reference data to each of the multiple first representations of the data (e.g., based on counts of differences, or bit errors, between the first representations and the reference data).

FIG. 8 depicts an embodiment of a system 800 including the host device 130 coupled to the data storage device 102 of FIG. 1. The data storage device 102 is configured to send multiple sets of read voltages to read a logical page of data from the non-volatile memory 104. The controller 120 changes values of each read voltage of each set of read voltages to read multiple different representations of the same logical page, such as a representative lower logical page 820, a representative middle logical page 822, or a representative upper logical page 824 stored in the group of storage elements 106.

For example, a first set of read voltages 870 includes a first value of a first read voltage and a first value of a second read voltage (e.g., the set {first trial value 191 of VA, first trial value 161 of VE}). A first representation 880 of the data may be read from the logical page (e.g., the lower logical page 820) using the first set of read voltages 870. Values of the first read voltage and the second read voltage are adjusted to form a second set of read voltages to read additional representations of the data from the logical page. An Nth set of read voltages 872 (e.g., the set {fifth trial value 195 of VA, fifth trial value 165 of VE} where N=5) may be sent to the non-volatile memory 104 to read an Nth representation 882 of the data from the logical page using the Nth set of read voltages 872. The multiple representations 880-882 of the data from the logical page are stored in the memory 152 as stored representations 810.

The controller 120 includes a read simulator 802 that is configured to generate simulated representations of the data based on the stored representations 810. For example, the read simulator 802 may be configured to determine a threshold voltage range of each storage element that stores data of the logical page (e.g., the storage element 108) and to generate a bit value of the data stored in the storage element during a simulated read of the logical page. To illustrate, the bits with bit index 0 in each of the stored representations 810 correspond to a single storage element, the bits with bit index 1 correspond to another storage element, etc. The bit values for each bit index may be arranged according to a first mapping 892 that maps threshold voltage regions to bit sequences.

For example, the storage elements may be programmed to have a threshold voltage distribution similar to the distribution depicted in a graph 890. Each of eight states (Er, A, B, C, D, E, F, and G) can represent a three-bit data sequence as described with respect to FIG. 1. A "lower" logical page can have a 1' value for storage elements in states Er, E, F, or G and a '0' value for storage elements in states A, B, C, or D. The lower logical page can be read by sensing the storage element using the read voltage VA and the read voltage VE and performing a logical combination of the sensing results (e.g., sense(VA) OR NOT(sense(VE)).

A storage element having a threshold voltage less than the first trial voltage 191 (corresponding to voltage region "1" in the first mapping 892) is read as having a "1" bit value in the lower logical page in each of the stored representations 810, forming a bit sequence "11111" for the depicted example where N=5. A storage element having a threshold voltage between the fifth trial voltage 195 of VA and the first trial voltage 161 of VE (corresponding to voltage region "6" in the first mapping 892) is read as having a "0" bit value in the lower logical page in each of the stored representations 810, forming a bit sequence "00000". A storage element having a threshold voltage greater than the fifth trial voltage 165 of VE (corresponding to voltage region "11" in the first mapping 892) is read as having a "1" bit value in the lower logical page in each of the stored representations 810, forming a bit sequence "11111".

Storage elements having threshold voltages that are outside of regions 1, 6, and 11, and that are in any of voltage regions 2-5 and 7-10 as depicted in the first mapping 892, have a bit value in the lower logical page that changes based on which set of read voltages 870-872 is used to read the storage element. For example, a storage element having a threshold voltage between the first trial voltage 191 of VA and the second trial voltage 192 of VA is read as storing a lower logical page value of "0" when sensed using the first trial voltage 191 of VA and has a "0" bit in the first representation 880. However, the storage element is read as storing a lower logical page value of "1" when sensed using the other trial values 192-195 of VA and has a "1" bit in the 2nd-5th representations, resulting in a bit sequence of "11110" according to the first mapping 892. As another example, for a storage element having a threshold voltage in region 9 (between the third trial voltage 163 and the fourth trial voltage 164 of VE), the threshold voltage of the storage element may be represented by the bit sequence "11100" according to the first mapping 892. As illustrated in the first mapping 892, bit sequences for adjacent voltage regions may differ by a single bit, resulting in a Gray code encoding.

The read simulator 802 may be configured to read the bit sequence corresponding to a particular storage element from the stored representations 810 and to emulate, based on the voltage region corresponding to the bit sequence, the result of reading the lower logical page bit of the storage element using a particular trial value 191-195 for VA and a particular trial value 161-165 for VE. In the illustrated example, although the controller 120 sends five sets 870-872 of read voltages and receives five representations 880-882 of the data of the logical page, the read simulator 802 can use the stored representations 810 to simulate up to 25 different read operations (i.e., (5 values of VA)×(5 values of VE)). For example, because the stored representations 810 represent a threshold voltage region of each storage element that stores the data of the logical page, the read simulator 802 can select sets of read voltages and determine, based on the stored representations 810, a logical value of each storage element based on the storage element's threshold voltage region relative to the read voltages of the selected sets of read voltages. The read simulator 802 may be configured to generate multiple representations 814 of the data that simulate results of multiple read operations using different read voltages and to provide the multiple representations 814 to the ECC engine 122 for decoding.

The decoder 126 of the ECC engine 122 is configured to decode each of the multiple representations 814 received from the read simulator 802 and to generate ECC related information, such as a syndrome weight, decoding time, bit flip count, error count, etc., as described with respect to FIG. 1. In a particular implementation, the read voltage update engine 140 is configured to receive a syndrome weight for each of the multiple representations 814 and to select updated read voltages based on which of the representations 814 results in a lowest syndrome weight. A syndrome weight of a representation of an ECC codeword may be determined without fully decoding the codeword and may indicate how many errors are in the representation. In general, a representation having a larger syndrome weight has more bit errors than a representation having a smaller syndrome weight.

Although one or more of the multiple representations 814 may include a number of errors exceeding a correction capacity of the decoder 126, some or all of the representations 814 may be error-free or may contain errors in sufficiently low amounts to be fully correctable by the decoder 126. ECC results of the representations 814 may be compared to determine a "best" set of read voltages among multiple sets of read voltages that each generates correctable data. The read voltage update process is therefore not limited to "heroics" scenarios that attempt to generate correctable data by changing read voltages in response to a default set of read voltages resulting in uncorrectable errors. For example, the read voltage update process may be used according to a scheduled or routine housekeeping process (e.g., based on a count of program/erase (P/E) cycles, based on an error rate exceeding an update threshold that is less than a decoding capacity limit, based on one or more other block or die health metrics, or any combination thereof).

During operation, the controller 120 may send the multiple sets 870-872 of read voltages to the non-volatile memory 104 and receive the representations 880-882 from the non-volatile memory 104. The controller 120 may store the received representations 880-882 in the memory 152 as the stored representations 810. The read simulator 802 may access the stored representations 810 to generate the representations 814 in a digital domain (as compared to sensing storage elements in an analog domain in the non-volatile memory 104).

The read simulator 802 may provide the representations 814 to an input of the decoder 126, and the decoder 126 may at least partially decode each of the representations 814 to generate ECC related information such as syndrome weight. The read voltage update engine 140 may select the updated set of read voltages 146 based on comparisons of the ECC related information from the decoder 126, such as described with respect to FIG. 1. For example, the set of read voltages used to generate a representation 814 that results in ECC related information indicating a fewest number of detected or estimated errors (as compared to the other representations 814 generated based on other sets of read voltages) may be selected as the updated set of read voltages 146. The controller 120 may use the updated set of read voltages 146 in subsequent accesses of a lower logical page from the group of storage elements 106. Because storage elements in a same physical region of the non-volatile memory 104 may have similar characteristics and exhibit similar wear, the updated group of read voltages 146 may also be used to accurately read other storage elements in the non-volatile memory 104, such as storage elements in a same word line as the group of storage elements 106 and/or in the same erase block as the group of storage elements 106. In some implementations, the updated group of read voltages 146 may be used to read other storage elements in other blocks in the same plane as the group of storage elements 106. In some implementations, the updated group of read voltages 146 may be used to read other storage elements in other blocks and/or planes of the same die as the group of storage elements 106.

In some implementations, the read simulator 802 may generate the representations 814 to represent every possible combination of the read voltages, such as twenty-five representations for five trial voltages of each of two read voltages, or 125 representations for five trial voltages of each of three read voltages. In other implementations, the read simulator 802 may generate the representations 814 according to a process that varies one read voltage at a time. For example, the read simulator 802 may first generate five representations using different trial values of VA without varying VE, and the read simulator 802 may generate another five representations using different trial values of VE and using the trial value of VA that resulted in fewest errors (or lowest syndrome weight, shortest decode time, fewest bit flips during decoding, etc.).

Thus, the data storage device 102 can use results of five read operations to test up to twenty-five data representations and select the read voltages that result in the fewest errors without fully decoding any of the twenty-five data representations. Latency due to data transfer from the non-volatile memory 104 to the controller 120 is reduced as compared to a device that reads all tested data representations from a memory to compare error rates. Latency due to error detection and correction may also be reduced by using syndrome weights as compared to a device that fully decodes each tested data representation.

Although the system 800 is described as using five sets of read voltages 870-872 and generating up to twenty-five representations of the data for comparison, in other implementations other numbers of sets of read voltages and simulated representations may be used. For example, an implementation using three trial voltages for each read voltage may send three sets of read voltages to read a page from the memory and generate nine representations of the page for comparison using the decoder 126. An implementation using ten trial voltages for each read voltage may send ten sets of read voltages to read a page from the memory and generate one hundred representations of the page for comparison using the decoder 126.

Although the example of operation of the system 800 describes reading a lower logical page using the VA and VE read voltages, other pages may be read using other read voltages. To illustrate, in a 2-3-2 implementation, an "upper" logical page may be read using the VC and VG voltages, and a "middle" logical page may be read using the VB, VD, and VF read voltages. Reading the middle logical page may also include performing an additional sense operation to distinguish between lower-voltage states and higher-voltage states that may produce the same bit sequence based on the representations 880-882. In other implementations, other logical page configurations may be used, such as a 1-2-4 implementation that uses VD to read the lower logical page, VB and VF to read the middle logical page, and VA, VC, VE, and VG to read the upper logical page. Although a three bits per cell (3BPC) configuration is described, other implementations may use a two bits per cell configuration or a configuration that stores more than three bits per cell.

FIG. 9 depicts an example of a mapping converter 902 that may be included in the data storage device 102 of the system 800 to re-map the stored representations 810 of FIG. 8. The mapping converter 902 is configured to receive an input bit sequence 910 and to generate an output bit sequence 912 that corresponds to a re-mapped version of the input bit sequence 910. The output bit sequence 912 may include fewer bits than the input bit sequence 910, and the resulting re-mapped data 920 may be stored into the memory 152 to replace the stored representations 810. The resulting re-mapped data 920 may use less space in the memory 152 than the stored representations 810 of FIG. 8.

The input bit sequence 910 may correspond to a bit value read from a storage element using different sets of read voltages, such as bit values corresponding to a single bit index in each of the representations 880-882. The input bit sequence 910 may be read from the stored representations 810 and processed by the mapping converter 902 to generate the output bit sequence 912. The mapping converter 902 may sequentially process each bit sequence corresponding to each bit index in the stored representations 810 to generate a set of output bit sequences to form the re-mapped data 920. The re-mapped data 920 may be stored into the memory 152 to replace the stored representations 810. For example, the re-mapped data 920 may be stored in the memory 152 after the re-mapped data 920 is generated. After storing the re-mapped data 920 in the memory 152, the stored representations 810 may be erased from the memory 152 and/or indicated as invalid data. As another example, the re-mapped data 920 may overwrite a portion of the stored representations 810 and a non-overwritten portion of the stored representations 810 may be erased from the memory 152 and/or indicated as invalid data.

Table 2 provides an example of a mapping between values of the input bit sequence 910 and values of the output bit sequence 912 for a six-bit representation of a middle logical page in a 2-3-2 implementation as described with respect to FIG. 8 (i.e., each representation corresponds to a different trial value of VB, VD, and VF, plus another bit indicating a sensing at VD). Each row of Table 2 corresponds to a distinct range of threshold voltages represented as a 6-bit Gray code value and a re-mapped O-bit binary value.

TABLE 2

| Input Bit Sequence (Gray) | Output Bit Sequence (Binary) |
| --- | --- |
| 111111 | 0000 |
| 111101 | 0001 |

TABLE 2-continued

| Input Bit Sequence (Gray) | Output Bit Sequence (Binary) |
| --- | --- |
| 111001 | 0010 |
| 110001 | 0011 |
| 100001 | 0100 |
| 000001 | 0101 |
| 000011 | 0110 |
| 000111 | 0111 |
| 001110 | 1000 |
| 011110 | 1001 |
| 111110 | 1010 |
| 111100 | 1011 |
| 111000 | 1100 |
| 110000 | 1101 |
| 100000 | 1110 |
| 000000 | 1111 |

In some implementations, the mapping conversion from the first mapping of the input bit sequence 910 to the second mapping of the output bit sequence 912 may be performed via a table lookup operation at a lookup table 904 of the mapping converter 902. For example, the lookup table 904 may include a separate table or set of entries for an upper logical page, a middle logical page, and a lower logical page. The input bit sequence 910 may be provided as an input to the lookup table 904, an entry corresponding to the input bit sequence 910 may be located, and a re-mapped value may be read out from the located entry as the output bit sequence 912. Alternatively, or in addition, the mapping converter 912 may include a mapping circuit 906 that is configured to perform one or more logical operations on the bits of the input bit sequence to generate the output bit sequence 912. As an example, referring to Table 2, the mapping circuit 906 may generate the most significant bit of the output bit sequence 912 for the lower logical page by applying a logical NOT operation to the least significant bit of the input bit sequence 910 for the lower logical page. The mapping circuit 906 may determine each of the other bits of the output bit sequence 912 by performing logical operations on one or more bits of the input bit sequence 910.

By re-mapping the stored representations 810 into the re-mapped data 920, the original representations 880-882 received from the non-volatile memory 104 may be erased from the memory 152 and data corresponding to the threshold voltage regions of the read storage elements may be stored in the memory 152 using less storage space than storing the original representations 880-882 received from the non-volatile memory 104. A size and/or cost of the controller memory 152 may therefore be reduced as compared to storing the original representations 880-882 without remapping because the re-mapped data 920 can be stored in a smaller amount of memory than the original representations 880-882. In addition, a complexity of the read simulator 802 may be reduced by operating on less-complex remapped bit sequences as compared to operating on a more complex Gray encoding of bit sequences.

FIG. 10 illustrates an example of a mapping checker 1002 that may be included with the mapping converter 902 of FIG. 9. Because one or more bits of an input bit sequence 1010 may be erroneous, a valid re-mapped bit sequence may not exist. For example, in an implementation of the mapping converter 902 that uses the lookup table 904, an entry may not exist in the lookup table 904 for an input bit sequence 1010 that is invalid.

The mapping checker 1002 may compare the input bit sequence 1010 to a table of valid words 1004. To illustrate, the table of valid words 1004 may correspond to the lookup table 904 and the mapping checker 1002 may determine whether any entry in the table of valid words 1004 corresponds to the input bit sequence 1010. In response to determining that the input bit sequence 1010 does not correspond to any entry in the table of valid words 1004 (i.e., is not a valid bit sequence according to the first mapping of voltage ranges to bit sequences), a distance calculator 1006 may compute a "distance" between the input bit sequence 1010 and one or more valid bit sequences of the first mapping. The mapping checker 1002 may provide the valid bit sequence that is determined to have the least distance to the input bit sequence 1010 as an output bit sequence 1012.

For example, the distance calculator 1006 may compute a number of bit differences between the input bit sequence 1010 and a particular valid bit sequence as the distance. To illustrate, the distance calculator 1006 may compute a Hamming distance. In other implementations, the distance calculator 1006 may determine one or more other distances, such as by weighting bit differences in one bit location as more significant than differences in another bit location to generate a "weighted" distance metric. If two or more valid bit sequences have a same distance from the input bit sequence 1010, the mapping checker 1002 may randomly select one of the valid bit sequences as the output bit sequence 1012 or may select one of the valid bit sequences according to one or more selection criteria. For example, if read noise appears more often with one of the valid bit sequences than with another valid bit sequence, the mapping checker 1002 may select the valid bit sequence associated with greater read noise.

By applying the mapping checker 1002 to detect and correct invalid input bit sequences, the mapping converter 902 may more accurately re-map the stored representations 810 in the presence of read noise or other sources of errors. The mapping checker 1002 enables error handling without including an entry in the lookup table 904 for every possible valid and invalid bit sequence, reducing a size of the lookup table 904. In implementations where the mapping converter 902 includes the mapping circuit 906, a complexity of the mapping circuit 906 may be reduced as compared to a complexity associated with mapping circuitry configured to detect and handle erroneous input bit sequences.

FIG. 11 depicts an interpolation filter 1102 that may be included in the data storage device 102 of FIG. 1 or FIG. 8. The interpolation filter 1102 may be configured to generate interpolation data 1112 based on a received set of syndrome weights 1110. The interpolation data 1112 may correspond to interpolated syndrome weights and may provide a finer "resolution" of syndrome values between trial values of read voltages. A peak detector 1114 may process the interpolation data 1112 to detect a peak (e.g., a highest value or a lowest value) in the interpolation data 1112, and a read voltage value corresponding to the detected peak may be provided as an output read voltage 1116.

A first graph 1140 illustrates a first set of syndrome weights 1121-1125 plotted as a function of read voltage. For example, the read voltage may be VA, and the first syndrome weight 1121 may correspond to the syndrome weight determined by the decoder 126 for a representation of lower logical page data read using the first trial voltage 191. The second syndrome weight 1122 may correspond to the data read using the second trial voltage 192, the third syndrome weight 1123 may correspond to the data read using the third trial voltage 193, the fourth syndrome weight 1124 may correspond to the data read using the fourth trial voltage 194, and the fifth syndrome weight 1125 may correspond to the data read using the fifth trial voltage 195.

The first set of syndrome weights may be processed by an upsampler 1104 of the interpolation filter 1104 to generate upsampled data 1105. A second graph 1160 illustrates an example of the upsampled data 1105. Although the second graph 1160 illustrates that the upsampler 1104 inserts six 0-valued syndrome weights (e.g., a representative set of six 0-valued syndrome weights 1162) between each of the syndrome weights 1121-1125, in other implementations any other number of entries may be inserted between each of the syndrome weights 1121-1125.

The upsampled data 1105 may be processed by a filter, such as a low-pass filter (LPF) 1106 to generate the interpolation data 1112. As illustrated in a third graph 1180, the interpolation data 1112 has an interpolated syndrome weight 1182 corresponding to a "peak" (a lowest syndrome value) at an interpolated read voltage, and the interpolated read voltage is between the third read voltage (of the third syndrome weight 1123) and the fourth read voltage (of the fourth syndrome weight 1124). The peak at the interpolated syndrome weight 1182 may be detected by the peak detector 1114 and the interpolated read voltage corresponding to the peak may be output as the output read voltage 1116.

The interpolation filter 1102 may be chosen from a group of multiple interpolation filters based on one or more characteristics of the data to be interpolated (e.g., the set of syndrome weights 1110). For example, a different interpolation filter may be selected for input data that has an outlier, such as a single syndrome weight having a significantly lower value than the rest of the syndrome weights in the input data. Such "corner cases" that may cause inaccuracies if interpolated by a conventional interpolation filter may be identified and one or more filters may be included in the data storage device 102 to interpolate syndrome data that matches a particular corner case. For example, interpolation filters may be implemented that ignore consecutive maximum values or that constrain the output to be no lower than the lowest input value.

By applying the interpolation filter 1102 to the set of syndrome weights corresponding to a particular read voltage, an updated value of the read voltage may be determined with an enhanced resolution as compared to the resolution of the trial values of the read voltage. As a result, a value of the read voltage may be determined using fewer sets of read voltages to read data from the non-volatile memory 104 as compared to reading the data at the enhanced resolution, reducing latency of performing a read voltage update operation and/or improving accuracy of the updated read voltage.

FIG. 12 illustrates a particular embodiment of a method 1200 of updating a set of read voltages. The method 1200 may be performed in a data storage device including a controller and a non-volatile memory. For example, the method 1200 may be performed in the data storage device 102 of FIG. 1 or FIG. 8.

A first read voltage and a second read voltage are iteratively adjusted to form sets of read voltages, at 1202. Each of the sets of read voltages includes a first value of the first read voltage and a second value of the second read voltage. For example, the sets of read voltages may correspond to the sets of read voltages 870-872 of FIG. 8. An adjustment of the second read voltage may be a function of an adjustment of the first read voltage. To illustrate, the function may correspond to equal adjustments made to the first read voltage and to the second read voltage, such as by equally incrementing each of the trial values 161-165 and the trial values 191-195 for each set of read voltages. As another example, a step size of the second read voltage may be determined as a function of the step size of the first read voltage, such as a linear function (e.g., a constant scaling) or a non-linear function (e.g., an exponential scaling).

Iteratively adjusting the first read voltage and the second read voltage to form the sets of read voltages may include forming a first set of read voltages that includes an initial value of the first read voltage (e.g., trial value 191) and that includes an initial value of the second read voltage (e.g., trial value 161). A first offset may be applied to the initial value of the first read voltage to generate a first adjusted value of the first read voltage (e.g., trial value 192). A second offset may be applied to the initial value of the second read voltage to generate a first adjusted value of the second read voltage (e.g., trial value 162). A second set of read voltages may be formed that includes the first adjusted value of the first read voltage and the first adjusted value of the second read voltage. A third set of read voltages may be formed by adjusting the first and second read voltages to form second adjusted values (e.g., trial value 193 and trial value 163) by applying offsets to the first adjusted values. A fourth set of read voltages may be formed by adjusting the first and second read voltages to form third adjusted values (e.g., trial value 194 and trial value 164) by applying offsets to the second adjusted values. A fifth set of read voltages may be formed by adjusting the first and second read voltages to form fourth adjusted values (e.g., trial value 195 and trial value 165) by applying offsets to the third adjusted values.

First representations of data are read from a logical page in the non-volatile memory according to the sets of read voltages, at 1204. The first representations of the data may correspond to multiple values of the first read voltage and the second read voltage. For example, one of the first representations of the data may correspond to the set of read voltages {trial value 191, trial value 161} and another of the first representations of the data may correspond to the set of read voltages {trial value 192, trial value 162}. The first representations of the data may correspond to the representations 880-882 of FIG. 8.

To illustrate, reading the first representations of the data from the logical page according to the sets of read voltages may include generating a first representation of the data according to a first set of read voltages (e.g., representation 880) and generating a second representation of the data according to a second set of read voltages (e.g., representation 882). The first representation may be generated by sensing a group of storage elements using the first value of the first read voltage of the first set of read voltages to generate first sensing data, sensing the group of storage elements using the second value of the second read voltage of the first set of read voltages to generate second sensing data, and performing a logical operation, such as a logical OR operation and a logical NOT operation as described with respect to FIG. 8, on the first sensing data and the second sensing data to generate the first representation of the data, such as described with respect to Table 1 and/or FIG. 8. The second representation of the data may be generated according to a second set of read voltages by sensing the group of storage elements using the first value of the first read voltage of the second set of read voltages to generate third sensing data, sensing the group of storage elements using the second value of the second read voltage of the second set of read voltages to generate fourth sensing data, and performing a logical operation on the third sensing data and the fourth sensing data to generate the second representation of the data.

The first representations of the data may be digitally stored in a memory, at 1206. For example, the first representations, such as the stored representations 810 of FIG. 8 or FIG. 9, may be stored into the memory 152 of FIG. 1 or FIG. 8. The first representations of the data may be converted from a first mapping of threshold voltage ranges to bit sequences to a second mapping that includes fewer bits per bit sequence than the first mapping. To illustrate, the stored representations 810 of FIG. 8 may be re-mapped by the mapping converter 902 of FIG. 9 to produce the re-mapped data 920. However, in some implementations the first representations of the data are not re-mapped.

Second representations of the data are generated based on the first representations, at 1208. The second representations correspond to adjusting the first read voltage and the second read voltage. Generating the second representations of the data may include generating a first trial value of the data corresponding to the first read voltage having a first voltage value and the second read voltage having a second voltage value and generating a second trial value of the data corresponding to the first read voltage having a third voltage value and the second read voltage having the second voltage value. For example, the second representations of data may correspond to the multiple representations 814 generated by the read simulator 802 of FIG. 8.

A value of the first read voltage is selected based on a comparison of syndrome weights corresponding to the second representations, at 1210. For example, the value of the first read voltage may be selected by the read voltage update engine 140 of FIG. 1 or FIG. 8. To illustrate, selecting the value of the first read voltage may include inputting the first trial value of the data to an ECC decoder (e.g., the decoder 126 of FIG. 1 or FIG. 8) and receiving a first syndrome weight from the ECC decoder. The first syndrome weight may be associated with a first number of errors corresponding to the first trial value of the data. The second trial value of the data may be input to the ECC decoder and a second syndrome weight may be received from the ECC decoder. The second syndrome weight may be associated with a second number of errors corresponding to the second trial value of the data. The value of the first read voltage may be selected to be the first voltage value in response to the first syndrome weight being a lowest of the syndrome weights. For example, when a first set of voltages is used to generate a first representation of the data that results in the first syndrome weight, and the first syndrome weight is the lowest of the syndrome weights, the voltage values in the first set of voltages may be selected to be the updated values of the read voltages. As an alternative, the value of the first read voltage may be selected to be the third voltage value in response to the second syndrome weight being the lowest of the syndrome weights. For example, when a second set of voltages is used to generate a second representation of the data that results in the second syndrome weight, and the second syndrome weight is the lowest of the syndrome weights, the voltage values in the second set of voltages may be selected to be the updated values of the read voltages.

In some embodiments, each syndrome weight of a first set of syndrome weights may be associated with a corresponding adjusted value of the first read voltage and may be based on the second representations of the data. A first interpolated syndrome weight may be generated based on the first set of syndrome weights, such as by the interpolation filter 1102 of FIG. 11. A value of the first read voltage may be selected based on a voltage associated with the first interpolated syndrome weight. For example, generating the first interpolated syndrome weight may include upsampling the first set of syndrome weights to generate upsampled data (e.g., as depicted in graph 1160 of FIG. 11), applying a low-pass filter to the upsampled data to generate interpolation data (e.g., as depicted in graph 1180 of FIG. 11), and locating a smallest interpolation data value in the interpolation data. For example, the peak detector 1114 of FIG. 11 may determine the output read voltage 1116 corresponding to the interpolated syndrome weight 1182. As described with respect to FIG. 11, the interpolation filter may be selected from a set of multiple interpolation filters based on the first set of syndrome weights by selecting a first interpolation filter from the set of multiple interpolation filters in response to the first set of syndrome weights matching a first pattern of syndrome weights or selecting a second interpolation filter from the set of multiple interpolation filters in response to the first set of syndrome weights not matching the first pattern of syndrome weights.

Thus, the method 1200 enables use of the first representations of the data to generate and test second representations of the data and to select the read voltages that result in the fewest estimated errors without fully decoding any of the data representations. Latency due to data transfer from the non-volatile memory to the controller may be reduced as compared to a device that reads all tested data representations from a memory to compare error rates. Latency due to error detection and correction may also be reduced by using syndrome weights as compared to a device that fully decodes each tested data representation.

Figure 13:
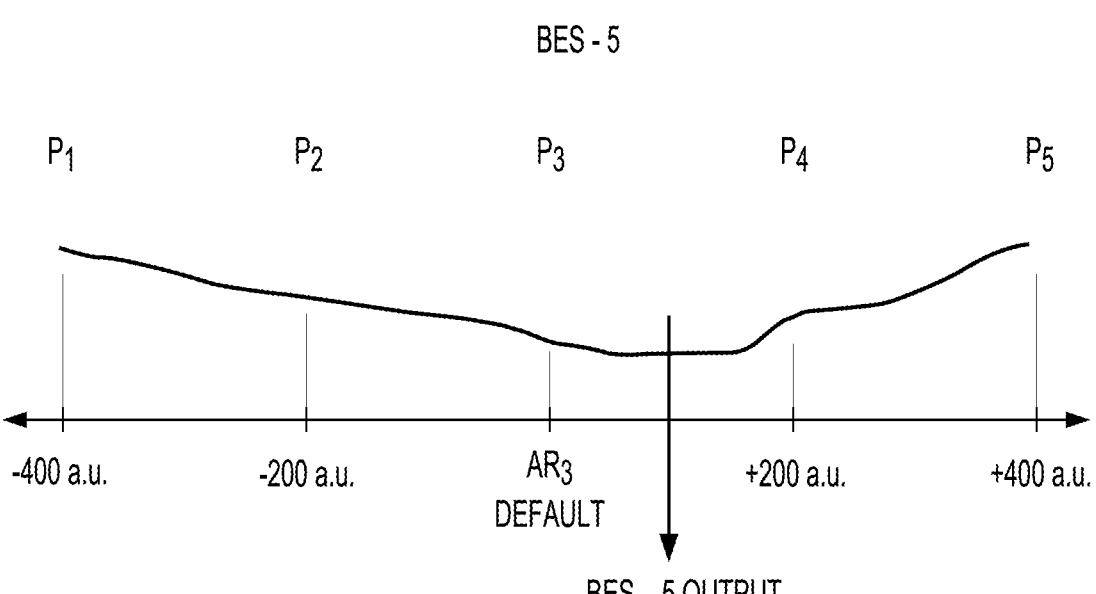
FIG. 13 shows a plot of syndrome weight at five different selected read levels for a first stage of an example bit error rate estimation scan technique according to aspects of the disclosure.
Figure 14:
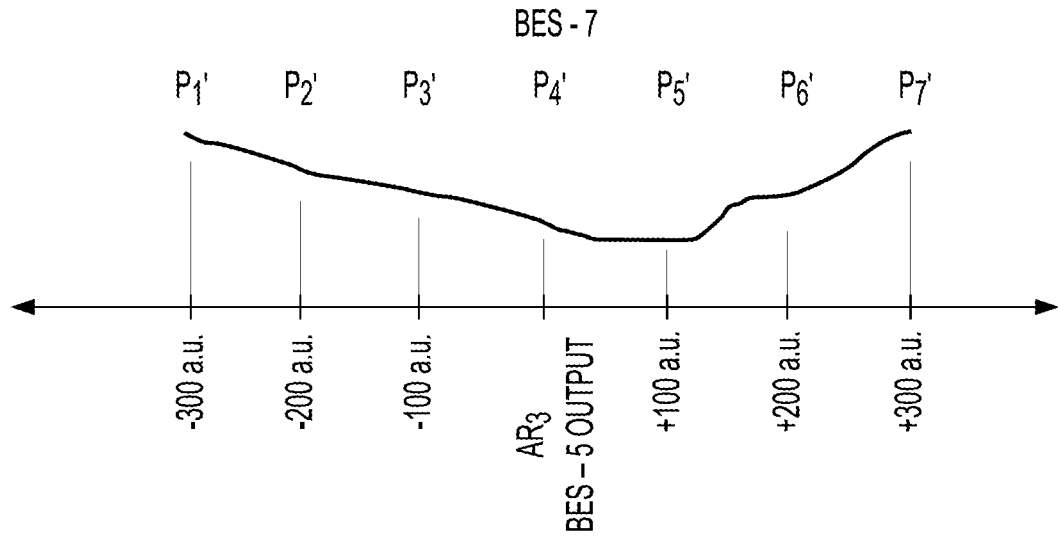
FIG. 14 shows a plot of syndrome weight at seven different selected read levels for a second stage of the example bit error rate estimation scan technique according to aspects of the disclosure.

As discussed above, a scan can be performed to determine an adjusted read level. Again, the scan can involve reading the memory cells at a number of different read levels for a particular data state and counting errors that arise in the data or bits stored. The read level for that particular data state can then be adjusted based on the count of the errors at each read level. Such scans may be known as bit error rate (BER) estimation scans (BES). FIG. 13 shows a plot of syndrome weight (SW) at five different selected read levels for a first stage of an example bit error rate estimation scan technique. The example technique of BES uses curve fitting to find out SW (and thus failure bit count (FBC)) minima by doing reads at each read level starting with fixed offsets around a default read level (indicated as $AR_3$ Default for the A state) in the first stage (BES-5). The results of the first stage typically necessitates a BES-7 (fine sweep) to be done after the first stage (BES-5) to achieve higher accuracy and better FBC results. FIG. 14 shows a plot of syndrome weight (SW) at seven different selected read levels for a second stage of the example bit error rate estimation scan technique. As shown, the example technique of BES can use the output of the first stage (BES-5) as a default value. In the example, the following range may be used for the first stage (BES-5), −400 a.u. to +400 a.u. with a step size of 200 a.u. For the second stage (BES-7), a range of −300 a.u. to +300 a.u. with a step size of 100 a.u. may be used. For the first stage (BES-5), all 5 read levels or voltage offsets are fixed relative to the default read level and the second stage (BES-7) are established at intervals of the step size on either side of the BES-5 output. However, as discussed, performing the scan to determine the adjusted read level can be time consuming due to the number of reads. In addition, for the example technique of BES, there is a tradeoff between range and accuracy.

Consequently, described herein is a memory apparatus (e.g., storage device 102 of FIG. 1) including memory cells (e.g., storage element 108 of FIG. 1) configured to retain a threshold voltage Vt or Vth corresponding to one of a plurality of programmed or data states (states Erase (Er), A, B, C, D, E, F, and G of FIGS. 1 and 8). For example, the memory cells may be connected to one of a plurality of word lines (e.g., word line of the group 106 of FIGS. 1 and 8) and disposed in memory holes (e.g., group of storage elements 108 of FIGS. 1 and 8 coupled together to form a vertical NAND string). The memory apparatus also includes a control circuit or means (e.g., controller 120 of FIGS. 1 and 8) coupled to the memory cells. The control means is configured to read the memory cells using a primary set of read level offsets from a default read level associated with one of the plurality of data states and determine a value of an error metric for each of the primary set of read level offsets (i.e., a first stage). The control means is also configured to read the memory cells using a secondary set of read level offsets from the default read level associated with the one of the plurality of data states and determine the value of the error metric for each of the secondary set of read level offsets (i.e., a second stage). The secondary set of read level offsets is based on the value of the error metric for each one of the read level offsets of the primary set. The control means is additionally configured to read the memory cells at an optimum read level associated with the one of the plurality of data states and determined based on analysis (e.g., calculated minima) of the value of the error metric for each of the read level offsets of both the primary set and the secondary set. The first and second stages of such a bit error rate estimation scan technique can be carried out for each of the plurality of data states, so that the optimum read level associated with each is determined and utilized by the control means.

Figure 15:
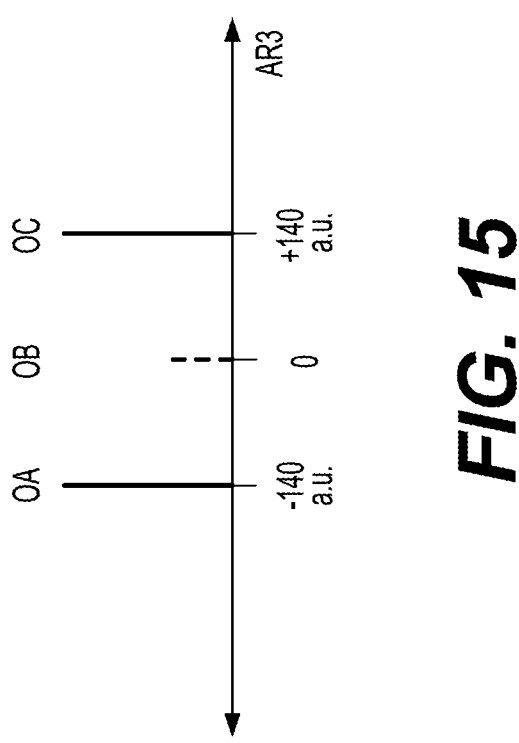
FIG. 15 shows an example of a first primary set read level offset and a second primary set read level offset and a third primary set read level offset according to aspects of the disclosure.

In more detail and according to an aspect, in the first stage, the primary set of read level offsets includes a first primary set read level offset OA and a second primary set read level offset OB and a third primary set read level offset OC. FIG. 15 shows an example of the first primary set read level offset OA (e.g., −140 a.u.) and the second primary set read level offset OB (e.g., 0 a.u.) and the third primary set read level offset OC (e.g., +140 a.u.). If as shown in FIG. 15, the second primary set read level offset OB is 0 a.u., the read level using the second primary set read level offset OB is the default read level offset for the one of the plurality of data states. Also, as shown, the first primary set read level offset OA is less than the second primary set read level offset OB by a primary set step size (e.g., 140 a.u.) and the third primary set read level offset OC is greater than the second primary set read level offset OB by the primary set step size. The primary set step size (e.g., 140 a.u.) may, for example, be less than the step size of the example bit error rate estimation scan technique of FIGS. 13 and 14 (step size of 200 a.u.) to improve accuracy.

Figure 16:
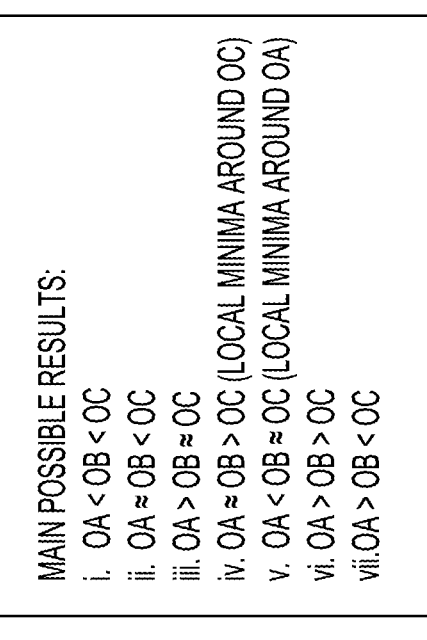
FIG. 16 is a list of a plurality of possible arrangements of the error metrics at each of the primary set of read level offsets according to aspects of the disclosure.

FIG. 16 is a list of a plurality of possible arrangements of the error metrics at each of the primary set of read level offsets (i.e., three point cases). So, the plurality of three point cases correspond to and are defined by relative magnitudes of the value of the error metric for the first primary set read level offset OA and the second primary set read level offset OB and the third primary set read level offset OC. The plurality of three point cases includes a first three point case in which the value of the error metric at the first primary set read level offset OA is less than the value of the error metric at the second primary set read level offset OB and the value of the error metric at the second primary set read level offset OB is less than the value of the error metric at the third primary set read level offset OC. The plurality of three point cases also includes a second three point case in which the value of the error metric at the first primary set read level offset OA is approximately equal to the value of the error metric at the second primary set read level offset OB and the value of the error metric at the second primary set read level offset OB is less than the value of the error metric at the third primary set read level offset OC. In addition, the plurality of three point cases includes a third three point case in which the value of the error metric at the first primary set read level offset OA is greater than the value of the error metric at the second primary set read level offset OB and the value of the error metric at the second primary set read level offset OB is approximately equal to the value of the error metric at the third primary set read level offset OC. The plurality of three point cases additionally includes a fourth three point case in which the value of the error metric at the first primary set read level offset OA is approximately equal to the value of the error metric at the second primary set read level offset OB and the value of the error metric at the second primary set read level offset OB is greater than the value of the error metric at the third primary set read level offset OC. Furthermore, the plurality of three point cases includes a fifth three point case in which the value of the error metric at the first primary set read level offset OA is less than the value of the error metric at the second primary set read level offset OB and the value of the error metric at the second primary set read level offset OB is approximately equal to the value of the error metric at the third primary set read level offset OC. Additionally, the plurality of three point cases includes a sixth three point case in which the value of the error metric at the first primary set read level offset OA is greater than the value of the error metric at the second primary set read level offset OB and the value of the error metric at the second primary set read level offset OB is greater than the value of the error metric at the third primary set read level offset OC. The plurality of three point cases also includes a seventh three point case in which the value of the error metric at the first primary set read level offset OA is greater than the value of the error metric at the second primary set read level offset OB and the value of the error metric at the second primary set read level offset OB is less than the value of the error metric at the third primary set read level offset OC.

So, according to another aspect, the control means is further configured to select the secondary set of read level offsets according to which of the plurality of three point cases corresponds to the relative magnitudes of the value of the error metric for the first primary set read level offset OA and the second primary set read level offset OB and the third primary set read level offset OC. Specifically, the control means can, for example, get a qualitative understanding of minima compared to the default read level offset by reading at the second primary set read level offset OB along with ±offsets around the second primary set read level offset OB. Thus, a binary search using the first three points (i.e., the first primary set read level offset OA and the second primary set read level offset OB and the third primary set read level offset OC) comprises the first stage and then the read voltages or read level offsets of additional read level offsets (i.e., secondary set of read level offsets) are decided in a second stage, as detailed below. The secondary set of the read level offsets can, for example, be less than the first primary set read level offset OA or greater than the third primary set read level offset OC.

According to another aspect, in the second stage, the secondary set of read level offsets includes, in order of increasing value, a first secondary set read level offset (e.g., −420 a.u.) and a second secondary set read level offset OA' (e.g., −280 a.u.) and a third secondary set read level offset OC' (e.g., +280 a.u.) and a fourth secondary set read level offset OC" (e.g., +420 a.u.). FIG. 17 lists the plurality of five point cases defined by relative magnitudes of the value of the error metric for the primary set of read level offsets and the secondary set of read level offsets along with the secondary set of read level offsets to be performed in the second stage for each of the plurality of five point cases. The plurality of five point cases correspond to and are defined by relative magnitudes of the value of the error metric for the first secondary set read level offset OA" and the second secondary set read level offset OA' and the first primary set read level offset OA and the second primary set read level offset OB and the third primary set read level offset OC and the third secondary set read level offset OC' and the fourth secondary set read level offset OC". FIG. 18 shows plots of the relative magnitudes of the value of the error metric for the primary set of read level offsets and the secondary set of read level offsets for each of the plurality of five point cases. As shown, according to an aspect, the second secondary set read level offset OA' is less than the first primary set read level offset OA by a secondary set step size (e.g., 140 a.u.). The first secondary set read level offset OA" is less than the second secondary set read level offset OA' by the secondary set step size. The third secondary set read level offset OC' is greater than the third primary set read level offset OC by the secondary set step size. The fourth secondary set read level offset is greater than the third secondary set read level offset OC' by the secondary set step size. Therefore, according to another aspect, the control means is further configured to read the memory cells using particular read level offsets of the secondary set (those that are highlighted in FIG. 17) corresponding with the one of the plurality of data states and determine the value of the error metric for each of the particular read level offsets of the secondary set in response to the relative magnitudes of the value of the error metric for the first primary set read level offset OA and the second primary set read level offset OB and the third primary set read level offset OC corresponding with one or more of the plurality of five point cases. The particular read level offsets of the secondary set are selected according to which of the plurality of five point cases corresponds to the relative magnitudes of the value of the error metric for the first primary set read level offset OA and the second primary set read level offset OB and the third primary set read level offset OC. So, for example, if the relative magnitudes of the value of the error metric for the first primary set read level offset OA and the second primary set read level offset OB and the third primary set read level offset OC match the five point case labeled C1.1 (i.e., the value of the error metric at the first primary set read level offset OA is less than the value of the error metric at the second primary set read level offset OB and the value of the error metric at the second primary set read level offset OB is less than the value of the error metric at the third primary set read level offset OC), the particular read level offsets of the secondary set would be selected as −420 a.u and −280 a.u. and there would be no need to perform additional reads to determine the error metric (e.g., syndrome weight or failure bit count) using the other read level offsets, such as +280 a.u. or +420 a.u.

Using the example read level offsets shown in FIGS. 17 and 18 for the first stage and the second stage increases net range of data collection by 5%, while also improving resolution by 30%. In more detail, the range of the example bit error rate estimation scan technique of FIGS. 13 and 14 is +400 a.u., but increases to +420 a.u. in the first and second stage detailed above. The resolution of the example bit error rate estimation scan technique of FIGS. 13 and 14 is +200 a.u. and this increases to +140 a.u. for the first and second stage detailed above. Only the two highlighted reads (i.e., particular read level offsets of the secondary set) need to be done in stage 2. Curve fitting is done using data collected of the error metric (e.g., SW and FBC) at the five points or offsets indicated as P1, P2, P3, P4, and P5 of FIG. 17. So, the error metric is determined for the particular read level offsets of the secondary set (e.g., P1, P2 for five point case C1.1) and the first primary set read level offset OA and the second primary set read level offset OB and the third primary set read level offset OC (e.g., P3, P4, and P5 for five point case C1.1) and then curve fitting is done by the control means. The control means is also configured to obtain a minima of the curve fitting, which defines the optimum read level. Thus, such a technique provides best of both range and accuracy by choosing the last read points or particular read level offsets of the secondary set instead of using static or unchanging read points.

According to aspects of the disclosure and referring back to FIG. 18, the plurality of five point cases includes a first five point case C1.1 in which the value of the error metric at the first secondary set read level offset OA" is less than the value of the error metric at the second secondary set read level offset OA' and the value of the error metric at the second secondary set read level offset OA' is less than the error metric at the first primary set read level offset OA. In the first five point case C1.1, the error metric at the first primary set read level offset OA is less than the value of the error metric at the second primary set read level offset OB and the value of the error metric at the second primary set read level offset OB is less than the value of the error metric at the third primary set read level offset OC. The plurality of five point cases also includes a second five point case C1.2 in which the value of the error metric at the first secondary set read level offset OA" greater than or equal to the value of the error metric at the second secondary set read level offset OA' and the value of the error metric at the second secondary set read level offset OA' is less than the error metric at the first primary set read level offset OA. In the second five point case C1.2, the value of the error metric at the first primary set read level offset OA is less than the value of the error metric at the second primary set read level offset OB and the value of the error metric at the second primary set read level offset OB is less than the value of the error metric at the third primary set read level offset OC. The plurality of five point cases additionally includes a third five point case C2 in which the value of the error metric at the second secondary set read level offset OA' is greater than the error metric at the first primary set read level offset OA and the value of the error metric at the first primary set read level offset OA is approximately equal to the value of the error metric at the second primary set read level offset OB. In the third five point case C2, the value of the error metric at the second primary set read level offset OB is less than the value of the error metric at the third primary set read level offset OC and the value of the error metric at the third primary set read level offset OC is less than the value of the error metric at the third secondary set read level offset OC'. In addition, the plurality of five point cases includes a fourth five point case C3 in which the value of the error metric at the first primary set read level offset OA is greater than the value of the error metric at the second primary set read level offset OB and the value of the error metric at the second primary set read level offset OB is less than the value of the error metric at the third primary set read level offset OC or the value of the error metric at the first primary set read level offset OA is approximately equal to the value of the error metric at the second primary set read level offset OB and the value of the error metric at the second primary set read level offset OB is greater than the value of the error metric at the third primary set read level offset OC or the value of the error metric at the first primary set read level offset OA is less than the value of the error metric at the second primary set read level offset OB and the value of the error metric at the second primary set read level offset OB is approximately equal to the value of the error metric at the third primary set read level offset OC. The plurality of five point cases additionally includes a fifth five point case C4 in which the value of the error metric at the second secondary set read level offset OA' is greater than the error metric at the first primary set read level offset OA and the value of the error metric at the first primary set read level offset OA is greater than the value of the error metric at the second primary set read level offset OB. In fifth five point case C4, the value of the error metric at the second primary set read level offset OB is approximately equal to the value of the error metric at the third primary set read level offset OC and the value of the error metric at the third primary set read level offset OC is less than the value of the error metric at the third secondary set read level offset OC'. Additionally, the plurality of five point cases includes a sixth five point case C5.1 in which the value of the error metric at the first primary set read level offset OA is greater than the value of the error metric at the second primary set read level offset OB and the value of the error metric at the second primary set read level offset OB is greater than the value of the error metric at the third primary set read level offset OC. In the sixth five point case C5.1, the value of the error metric at the third primary set read level offset OC is greater than the value of the error metric at the third secondary set read level offset OC' and the value of the error metric at the third secondary set read level offset OC' is less than or equal to the value of the error metric at the fourth secondary set read level offset OC". Furthermore, the plurality of five point cases includes a seventh five point case C5.2 in which the value of the error metric at the first primary set read level offset OA is greater than the value of the error metric at the second primary set read level offset OB and the value of the error metric at the second primary set read level offset OB is greater than the value of the error metric at the third primary set read level offset OC. In the seventh five point case C5.2, the value of the error metric at the third primary set read level offset OC is greater than the value of the error metric at the third secondary set read level offset OC' and the value of the error metric at the third secondary set read level offset OC' is greater than the value of the error metric at the fourth secondary set read level offset OC".

Thus, the control means can further be configured to read the memory cells using the first secondary set read level offset OA" and the second secondary set read level offset OA' corresponding with the one of the plurality of data states and determine the value of the error metric for each of the first secondary set read level offset OA" and the second secondary set read level offset OA' in response to the relative magnitudes of the value of the error metric for the first primary set read level offset OA and the second primary set read level offset OB and the third primary set read level offset OC corresponding with one of the first five point case and the second five point case. In addition, the control means can further be configured to read the memory cells using the second secondary set read level offset OA' and the third secondary set read level offset OC' corresponding with the one of the plurality of data states and determine the value of the error metric for each of the second secondary set read level offset OA' and the third secondary set read level offset OC' in response to the relative magnitudes of the value of the error metric for the first primary set read level offset OA and the second primary set read level offset OB and the third primary set read level offset OC corresponding with one of the third five point case and the fourth five point case and the sixth five point case. In addition, the control means can further be configured to read the memory cells using the third secondary set read level offset OC' and the fourth secondary set read level offset OC" corresponding with the one of the plurality of data states and determine the value of the error metric for each of the third secondary set read level offset OC' and the fourth secondary set read level offset OC" in response to the relative magnitudes of the value of the error metric for the first primary set read level offset OA and the second primary set read level offset OB and the third primary set read level offset OC corresponding with one of the sixth five point case and the seventh five point case. According to an aspect, the primary set step size is equal to the secondary set step size.

FIG. 19 lists the plurality of five point cases defined by relative magnitudes of the value of the error metric for the primary set of read level offsets and the secondary set of read level offsets along with additional read level offsets of the secondary set to be performed in the second stage for each of the plurality of five point cases. So, according to another aspect, the secondary set of read level offsets include, in order of increasing value and each separated from one another by a tertiary set step size (e.g., 70 a.u.), a fifth secondary set read level offset (e.g., −700 a.u.) and a sixth secondary set read level offset (e.g., −630 a.u.) and a seventh secondary set read level offset (e.g., −560 a.u.) and an eighth secondary set read level offset (e.g., −490 a.u.) and the first secondary set read level offset OA" and a ninth secondary set read level offset (e.g., −350 a.u.) and the second secondary set read level offset OA' and a tenth secondary set read level offset (e.g., −210 a.u.) and an eleventh secondary set read level offset (e.g., −70 a.u.) and an twelfth secondary set read level offset (e.g., +70 a.u.) and a thirteenth secondary set read level offset (e.g., +210 a.u.) and the third secondary set read level offset OC' and a fourteenth secondary set read level offset (e.g., +350 a.u.) and the fourth secondary set read level offset OC" and a fifteenth secondary set read level offset (e.g., +490 a.u.) and a sixteenth secondary set read level offset (e.g., +560 a.u.) and a seventeenth secondary set read level offset (e.g., +630 a.u.) and an eighteenth secondary set read level offset (e.g., +700 a.u.). Thus, the control means is further configured to read the memory cells using specific read level offsets of the secondary set (those that are highlighted in FIG. 19) corresponding with the one of the plurality of data states and determine the value of the error metric for each of the specific read level offsets of the secondary set in response to the relative magnitudes of the value of the error metric for the first primary set read level offset OA and the second primary set read level offset OB and the third primary set read level offset OC corresponding with one or more of the plurality of five point cases. The specific read level offsets of the secondary set are selected according to which of the plurality of five point cases corresponds to the relative magnitudes of the value of the error metric for the first primary set read level offset OA and the second primary set read level offset OB and the third primary set read level offset OC.

According to an aspect, the memory cells may be read using the specific read level offsets of the secondary set only after stage 2, as described above, has been completed (i.e., as part of stage 2) and the optimum read level after the reads for stage two per FIG. 17 still result in relatively high FBCs (e.g., exceeding a predefined threshold). As with the reads for stage two per FIG. 17, only the 3-5 highlighted reads (i.e., particular read level offsets of the secondary set) need to be performed instead of the 7 full new reads like in FIG.

14 discussed above. Once again, curve fitting is done using data collected of the error metric (e.g., SW and FBC) at the five points or offsets indicated as P1, P2, P3, P4, and P5 of FIG. 19. Therefore, the error metric is determined for the particular read level offsets of the secondary set (e.g., P1, P2, P3, P4, and P6 for five point case C1.1) and the second secondary set read level offset OA' and the first secondary set read level offset OA" (e.g., P5 and P7 for five point case C1.1) and then curve fitting is done by the control means. The control means is also configured to obtain a minima of the curve fitting, which defines another optimum read level. Thus, this is like the stage 2 described above with reference to FIG. 17, but with a finer sweep (i.e., smaller step size). Such additional reads provide capability like what is provided by the reads done in FIG. 14, but with lower parasitic read disturb, higher system performance, and improved resolution.

According to aspects of the disclosure, the first primary set read level offset OA is greater than the tenth secondary set read level offset (e.g., −210 a.u.) by the tertiary set step size and is less than the eleventh secondary set read level offset (e.g., −70 a.u.) by the tertiary set step size. The second primary set read level offset OB is greater than the eleventh secondary set read level offset (e.g., −70 a.u.) by the tertiary set step size and is less than the twelfth secondary set read level offset (e.g., +70 a.u.) by the tertiary set step size. The third primary set read level offset OC is greater than the twelfth secondary set read level offset (e.g., +70 a.u.) by the tertiary set step size and is less than the thirteenth secondary set read level offset (e.g., +210 a.u.) by the tertiary set step size.

So, the control means can be further configured to read the memory cells using the fifth secondary set read level offset and the sixth secondary set read level offset and the seventh secondary set read level offset and the eighth secondary set read level offset and the ninth secondary set read level offset corresponding with the one of the plurality of data states and determine the value of the error metric for each of the fifth secondary set read level offset and the sixth secondary set read level offset and the seventh secondary set read level offset and the eighth secondary set read level offset and the ninth secondary set read level offset in response to the relative magnitudes of the value of the error metric for the first primary set read level offset OA and the second primary set read level offset OB and the third primary set read level offset OC corresponding with the first five point case. The control means can also be configured to read the memory cells using the ninth secondary set read level offset and the tenth secondary set read level offset and the eleventh secondary set read level offset corresponding with the one of the plurality of data states and determine the value of the error metric for each of the ninth secondary set read level offset and the tenth secondary set read level offset and the eleventh secondary set read level offset in response to the relative magnitudes of the value of the error metric for the first primary set read level offset OA and the second primary set read level offset OB and the third primary set read level offset OC corresponding with the second five point case. In addition, the control means can be configured to read the memory cells using the tenth secondary set read level offset and the eleventh secondary set read level offset and the twelfth secondary set read level offset corresponding with the one of the plurality of data states and determine the value of the error metric for each of the tenth secondary set read level offset and the eleventh secondary set read level offset and the twelfth secondary set read level offset in response to the relative magnitudes of the value of the error metric for the first primary set read level offset OA and the second primary set read level offset OB and the third primary set read level offset OC corresponding with the third five point case. The control means can additionally be configured to read the memory cells using the eleventh secondary set read level offset and the twelfth secondary set read level offset and the thirteenth secondary set read level offset corresponding with the one of the plurality of data states and determine the value of the error metric for each of the eleventh secondary set read level offset and the twelfth secondary set read level offset and the thirteenth secondary set read level offset in response to the relative magnitudes of the value of the error metric for the first primary set read level offset OA and the second primary set read level offset OB and the third primary set read level offset OC corresponding with the fifth five point case. Furthermore, the control means can be configured to read the memory cells using the twelfth secondary set read level offset and the thirteenth secondary set read level offset and the fourteenth secondary set read level offset corresponding with the one of the plurality of data states and determine the value of the error metric for each of the twelfth secondary set read level offset and the thirteenth secondary set read level offset and the fourteenth secondary set read level offset in response to the relative magnitudes of the value of the error metric for the first primary set read level offset OA and the second primary set read level offset OB and the third primary set read level offset OC corresponding with the sixth five point case. The control means can also be configured to read the memory cells using the twelfth secondary set read level offset and the thirteenth secondary set read level offset and the fourteenth secondary set read level offset corresponding with the one of the plurality of data states and determine the value of the error metric for each of the twelfth secondary set read level offset and the thirteenth secondary set read level offset and the fourteenth secondary set read level offset in response to the relative magnitudes of the value of the error metric for the first primary set read level offset OA and the second primary set read level offset OB and the third primary set read level offset OC corresponding with the sixth five point case. Additionally, the control means can be configured to read the memory cells using the fourteenth secondary set read level offset and the fifteenth secondary set read level offset and the sixteenth secondary set read level offset and the seventeenth secondary set read level offset and the eighteenth secondary set read level offset corresponding with the one of the plurality of data states and determine the value of the error metric for each of the fourteenth secondary set read level offset and the fifteenth secondary set read level offset and the sixteenth secondary set read level offset and the seventeenth secondary set read level offset and the eighteenth secondary set read level offset in response to the relative magnitudes of the value of the error metric for the first primary set read level offset OA and the second primary set read level offset OB and the third primary set read level offset OC corresponding with the seventh five point case According to an aspect, the primary set step size and secondary step size are greater than the tertiary set step size. While various read level offsets and steps sizes are described above and shown in FIGS. 15-19, it should be understood that these are for illustrative purposes and other read level offsets and step sizes are envisaged.

The memory apparatus can also include an error correcting code engine (e.g., ECC engine 122 of FIGS. 1 and 8) configured to generate a syndrome weight corresponding to a failure bit count of data being read from the memory cells. So, according to an aspect and as mentioned above, the error metric is the syndrome weight. Thus, the control means is further configured to determine the value of the syndrome weight for each of the primary set of read level offsets and the primary set of read level offsets using the error correcting code engine.

FIG. 20 illustrates steps of a method of operating a memory apparatus. As discussed above, the memory apparatus (e.g., storage device 102 of FIG. 1) includes memory cells (e.g., storage element 108 of FIG. 1) configured to retain a threshold voltage Vt or Vth corresponding to one of a plurality of programmed or data states (states Erase (Er), A, B, C, D, E, F, and G of FIGS. 1 and 8). Referring to FIG. 20, the method includes the step of 2000 reading the memory cells using a primary set of read level offsets from a default read level associated with one of the plurality of data states and determine a value of an error metric for each of the primary set of read level offsets. The method also includes the step of 2002 reading the memory cells using a secondary set of read level offsets from the default read level associated with the one of the plurality of data states and determining the value of the error metric for each of the secondary set of read level offsets, the secondary set of read level offsets based on the value of the error metric for each one of the read level offsets of the primary set. The next step of the method is 2004 reading the memory cells at an optimum read level associated with the one of the plurality of data states and determined based on analysis of the value of the error metric for each of the read level offsets of both the primary set and the secondary set.

Again, according to an aspect, the primary set of read level offsets includes the first primary set read level offset OA and the second primary set read level offset OB and the third primary set read level offset OC. As discussed above, the second primary set read level offset OB can be zero (i.e., the read level using the second primary set read level offset OB is the default read level offset for the one of the plurality of data states). The first primary set read level offset OA is less than the second primary set read level offset OB by the primary set step size (e.g., 140 a.u.) and the third primary set read level offset OC is greater than the second primary set read level offset OB by the primary set step size. The plurality of three point cases correspond to and are defined by relative magnitudes of the value of the error metric for the first primary set read level offset OA and second primary set read level offset OB and the third primary set read level offset OC. The plurality of three point cases includes the first three point case in which the value of the error metric at the first primary set read level offset OA is less than the value of the error metric at the second primary set read level offset OB and the value of the error metric at the second primary set read level offset OB is less than the value of the error metric at the third primary set read level offset OC. The plurality of three point cases also includes the second three point case in which the value of the error metric at the first primary set read level offset OA is approximately equal to the value of the error metric at the second primary set read level offset OB and the value of the error metric at the second primary set read level offset OB is less than the value of the error metric at the third primary set read level offset OC. In addition, the plurality of three point cases includes the third three point case in which the value of the error metric at the first primary set read level offset OA is greater than the value of the error metric at the second primary set read level offset OB and the value of the error metric at the second primary set read level offset OB is approximately equal to the value of the error metric at the third primary set read level offset OC. The plurality of three point cases additionally includes the fourth three point case in which the value of the error metric at the first primary set read level offset OA is approximately equal to the value of the error metric at the second primary set read level offset OB and the value of the error metric at the second primary set read level offset OB is greater than the value of the error metric at the third primary set read level offset OC. Furthermore, the plurality of three point cases includes the fifth three point case in which the value of the error metric at the first primary set read level offset OA is less than the value of the error metric at the second primary set read level offset OB and the value of the error metric at the second primary set read level offset OB is approximately equal to the value of the error metric at the third primary set read level offset OC. Additionally, the plurality of three point cases includes the sixth three point case in which the value of the error metric at the first primary set read level offset OA is greater than the value of the error metric at the second primary set read level offset OB and the value of the error metric at the second primary set read level offset OB is greater than the value of the error metric at the third primary set read level offset OC. The plurality of three point cases also includes the seventh three point case in which the value of the error metric at the first primary set read level offset OA is greater than the value of the error metric at the second primary set read level offset OB and the value of the error metric at the second primary set read level offset OB is less than the value of the error metric at the third primary set read level offset OC.

Therefore, according to another aspect, the method further includes the step of selecting the secondary set of read level offsets according to which of the plurality of three point cases corresponds to the relative magnitudes of the value of the error metric for the first primary set read level offset OA and the second primary set read level offset OB and the third primary set read level offset OC. Again, the secondary set of read level offsets may be less than the first primary set read level offset OA or greater than the third primary set read level offset OC.

According to another aspect, the secondary set of read level offsets includes, in order of increasing value, the first secondary set read level offset OA" and the second secondary set read level offset OA' and the third secondary set read level offset OC' and the fourth secondary set read level offset OC". The second secondary set read level offset OA' is less than the first primary set read level offset OA by the secondary set step size (e.g., 140 a.u.). The first secondary set read level offset OA" is less than the second secondary set read level offset OA' by the secondary set step size. The third secondary set read level offset OC' is greater than the third primary set read level offset OC by the secondary set step size. The fourth secondary set read level offset is greater than the third secondary set read level offset OC' by the secondary set step size. The plurality of five point cases correspond to and are defined by relative magnitudes of the value of the error metric for the first secondary set read level offset OA" and the second secondary set read level offset OA' and the first primary set read level offset OA and the second primary set read level offset OB and the third primary set read level offset OC and the third secondary set read level offset OC' and the fourth secondary set read level offset OC".

Thus, according to another aspect, the method also includes reading the memory cells using particular read level offsets of the secondary set corresponding with the one of the plurality of data states and determining the value of the error metric for each of the particular read level offsets of the secondary set in response to the relative magnitudes of the value of the error metric for the first primary set read level offset OA and the second primary set read level offset OB and the third primary set read level offset OC corresponding with one or more of the plurality of five point cases. Again, the particular read level offsets of the secondary set are selected according to which of the plurality of five point cases corresponds to the relative magnitudes of the value of the error metric for the first primary set read level offset OA and the second primary set read level offset OB and the third primary set read level offset OC.

As discussed above, according to aspects of the disclosure, the plurality of five point cases includes the first five point case C1.1 in which the value of the error metric at the first secondary set read level offset OA" is less than the value of the error metric at the second secondary set read level offset OA' and the value of the error metric at the second secondary set read level offset OA' is less than the error metric at the first primary set read level offset OA. In the first five point case C1.1, the error metric at the first primary set read level offset OA is less than the value of the error metric at the second primary set read level offset OB and the value of the error metric at the second primary set read level offset OB is less than the value of the error metric at the third primary set read level offset OC. The plurality of five point cases also includes the second five point case C1.2 in which the value of the error metric at the first secondary set read level offset OA" greater than or equal to the value of the error metric at the second secondary set read level offset OA' and the value of the error metric at the second secondary set read level offset OA' is less than the error metric at the first primary set read level offset OA. In the second five point case C1.2, the value of the error metric at the first primary set read level offset OA is less than the value of the error metric at the second primary set read level offset OB and the value of the error metric at the second primary set read level offset OB is less than the value of the error metric at the third primary set read level offset OC. The plurality of five point cases additionally includes the third five point case C2 in which the value of the error metric at the second secondary set read level offset OA' is greater than the error metric at the first primary set read level offset OA and the value of the error metric at the first primary set read level offset OA is approximately equal to the value of the error metric at the second primary set read level offset OB. In the third five point case C2, the value of the error metric at the second primary set read level offset OB is less than the value of the error metric at the third primary set read level offset OC and the value of the error metric at the third primary set read level offset OC is less than the value of the error metric at the third secondary set read level offset OC'. In addition, the plurality of five point cases includes the fourth five point case C3 in which the value of the error metric at the first primary set read level offset OA is greater than the value of the error metric at the second primary set read level offset OB and the value of the error metric at the second primary set read level offset OB is less than the value of the error metric at the third primary set read level offset OC or the value of the error metric at the first primary set read level offset OA is approximately equal to the value of the error metric at the second primary set read level offset OB and the value of the error metric at the second primary set read level offset OB is greater than the value of the error metric at the third primary set read level offset OC or the value of the error metric at the first primary set read level offset OA is less than the value of the error metric at the second primary set read level offset OB and the value of the error metric at the second primary set read level offset OB is approximately equal to the value of the error metric at the third primary set read level offset OC. The plurality of five point cases additionally includes the fifth five point case C4 in which the value of the error metric at the second secondary set read level offset OA' is greater than the error metric at the first primary set read level offset OA and the value of the error metric at the first primary set read level offset OA is greater than the value of the error metric at the second primary set read level offset OB. In fifth five point case C4, the value of the error metric at the second primary set read level offset OB is approximately equal to the value of the error metric at the third primary set read level offset OC and the value of the error metric at the third primary set read level offset OC is less than the value of the error metric at the third secondary set read level offset OC'. Additionally, the plurality of five point cases includes the sixth five point case C5.1 in which the value of the error metric at the first primary set read level offset OA is greater than the value of the error metric at the second primary set read level offset OB and the value of the error metric at the second primary set read level offset OB is greater than the value of the error metric at the third primary set read level offset OC. In the sixth five point case C5.1, the value of the error metric at the third primary set read level offset OC is greater than the value of the error metric at the third secondary set read level offset OC' and the value of the error metric at the third secondary set read level offset OC' is less than or equal to the value of the error metric at the fourth secondary set read level offset OC". Furthermore, the plurality of five point cases includes a seventh five point case C5.2 in which the value of the error metric at the first primary set read level offset OA is greater than the value of the error metric at the second primary set read level offset OB and the value of the error metric at the second primary set read level offset OB is greater than the value of the error metric at the third primary set read level offset OC. In the seventh five point case C5.2, the value of the error metric at the third primary set read level offset OC is greater than the value of the error metric at the third secondary set read level offset OC' and the value of the error metric at the third secondary set read level offset OC' is greater than the value of the error metric at the fourth secondary set read level offset OC".

So, the method can further include the step of reading the memory cells using the first secondary set read level offset OA" and the second secondary set read level offset OA' corresponding with the one of the plurality of data states and determining the value of the error metric for each of the first secondary set read level offset OA" and the second secondary set read level offset OA' in response to the relative magnitudes of the value of the error metric for the first primary set read level offset OA and the second primary set read level offset OB and the third primary set read level offset OC corresponding with one of the first five point case and the second five point case. The method can also include reading the memory cells using the second secondary set read level offset OA' and the third secondary set read level offset OC' corresponding with the one of the plurality of data states and determining the value of the error metric for each of the second secondary set read level offset OA' and the third secondary set read level offset OC' in response to the relative magnitudes of the value of the error metric for the first primary set read level offset OA and the second primary set read level offset OB and the third primary set read level offset OC corresponding with one of the third five point case and the fourth five point case and the sixth five point case.

Thus, the method can additionally include the step of reading the memory cells using the third secondary set read level offset OC' and the fourth secondary set read level offset OC" corresponding with the one of the plurality of data states and determining the value of the error metric for each of the third secondary set read level offset OC' and the fourth secondary set read level offset OC" in response to the relative magnitudes of the value of the error metric for the first primary set read level offset OA and the second primary set read level offset OB and the third primary set read level offset OC corresponding with one of the sixth five point case and the seventh five point case. According to an aspect, the primary set step size is equal to the secondary set step size.

As discussed above an according to another aspect, the secondary set of read level offsets include, in order of increasing value and each separated from one another by the tertiary set step size (e.g., 70 a.u.), the fifth secondary set read level offset (e.g., −700 a.u.) and the sixth secondary set read level offset (e.g., −630 a.u.) and the seventh secondary set read level offset (e.g., −560 a.u.) and the eighth secondary set read level offset (e.g., −490 a.u.) and the first secondary set read level offset OA" and the ninth secondary set read level offset (e.g., −350 a.u.) and the second secondary set read level offset OA' and the tenth secondary set read level offset (e.g., −210 a.u.) and the eleventh secondary set read level offset (e.g., −70 a.u.) and the twelfth secondary set read level offset (e.g., +70 a.u.) and the thirteenth secondary set read level offset (e.g., +210 a.u.) and the third secondary set read level offset OC' and the fourteenth secondary set read level offset (e.g., +350 a.u.) and the fourth secondary set read level offset OC" and the fifteenth secondary set read level offset (e.g., +490 a.u.) and the sixteenth secondary set read level offset (e.g., +560 a.u.) and the seventeenth secondary set read level offset (e.g., +630 a.u.) and the eighteenth secondary set read level offset (e.g., +700 a.u.). So, the method further includes the step of reading the memory cells using specific read level offsets of the secondary set corresponding with the one of the plurality of data states and determining the value of the error metric for each of the specific read level offsets of the secondary set in response to the relative magnitudes of the value of the error metric for the first primary set read level offset OA and the second primary set read level offset OB and the third primary set read level offset OC corresponding with one or more of the plurality of five point cases. The specific read level offsets of the secondary set are selected according to which of the plurality of five point cases corresponds to the relative magnitudes of the value of the error metric for the first primary set read level offset OA and the second primary set read level offset OB and the third primary set read level offset OC.

Again, according to aspects of the disclosure, the first primary set read level offset OA is greater than the tenth secondary set read level offset (e.g., −210 a.u.) by the tertiary set step size and is less than the eleventh secondary set read level offset (e.g., −70 a.u.) by the tertiary set step size. The second primary set read level offset OB is greater than the eleventh secondary set read level offset (e.g., −70 a.u.) by the tertiary set step size and is less than the twelfth secondary set read level offset (e.g., +70 a.u.) by the tertiary set step size. The third primary set read level offset OC is greater than the twelfth secondary set read level offset (e.g., +70 a.u.) by the tertiary set step size and is less than the thirteenth secondary set read level offset (e.g., +210 a.u.) by the tertiary set step size.

Therefore, the method can further include the step of reading the memory cells using the fifth secondary set read level offset and the sixth secondary set read level offset and the seventh secondary set read level offset and the eighth secondary set read level offset and the ninth secondary set read level offset corresponding with the one of the plurality of data states and determining the value of the error metric for each of the fifth secondary set read level offset and the sixth secondary set read level offset and the seventh secondary set read level offset and the eighth secondary set read level offset and the ninth secondary set read level offset in response to the relative magnitudes of the value of the error metric for the first primary set read level offset OA and the second primary set read level offset OB and the third primary set read level offset OC corresponding with the first five point case. The method can also include the step of reading the memory cells using the ninth secondary set read level offset and the tenth secondary set read level offset and the eleventh secondary set read level offset corresponding with the one of the plurality of data states and determining the value of the error metric for each of the ninth secondary set read level offset and the tenth secondary set read level offset and the eleventh secondary set read level offset in response to the relative magnitudes of the value of the error metric for the first primary set read level offset OA and the second primary set read level offset OB and the third primary set read level offset OC corresponding with the second five point case. In addition, the method can include the step of reading the memory cells using the tenth secondary set read level offset and the eleventh secondary set read level offset and the twelfth secondary set read level offset corresponding with the one of the plurality of data states and determining the value of the error metric for each of the tenth secondary set read level offset and the eleventh secondary set read level offset and the twelfth secondary set read level offset in response to the relative magnitudes of the value of the error metric for the first primary set read level offset OA and the second primary set read level offset OB and the third primary set read level offset OC corresponding with the third five point case. The method can additionally include the step of reading the memory cells using the eleventh secondary set read level offset and the twelfth secondary set read level offset and the thirteenth secondary set read level offset corresponding with the one of the plurality of data states and determining the value of the error metric for each of the eleventh secondary set read level offset and the twelfth secondary set read level offset and the thirteenth secondary set read level offset in response to the relative magnitudes of the value of the error metric for the first primary set read level offset OA and the second primary set read level offset OB and the third primary set read level offset OC corresponding with the fifth five point case. Furthermore, the method can include the step of reading the memory cells using the twelfth secondary set read level offset and the thirteenth secondary set read level offset and the fourteenth secondary set read level offset corresponding with the one of the plurality of data states and determining the value of the error metric for each of the twelfth secondary set read level offset and the thirteenth secondary set read level offset and the fourteenth secondary set read level offset in response to the relative magnitudes of the value of the error metric for the first primary set read level offset OA and the second primary set read level offset OB and the third primary set read level offset OC corresponding with the sixth five point case. The method can also include the step of reading the memory cells using the twelfth secondary set read level offset and the thirteenth secondary set read level offset and the fourteenth secondary set read level offset corresponding with the one of the plurality of data states and determining the value of the error metric for each of the twelfth secondary set read level offset and the thirteenth secondary set read level offset and the fourteenth secondary set read level offset in response to the relative magnitudes of the value of the error metric for the first primary set read level offset OA and the second primary set read level offset OB and the third primary set read level offset OC corresponding with the sixth five point case. The method can further include the step of reading the memory cells using the fourteenth secondary set read level offset and the fifteenth secondary set read level offset and the sixteenth secondary set read level offset and the seventeenth secondary set read level offset and the eighteenth secondary set read level offset corresponding with the one of the plurality of data states and determining the value of the error metric for each of the fourteenth secondary set read level offset and the fifteenth secondary set read level offset and the sixteenth secondary set read level offset and the seventeenth secondary set read level offset and the eighteenth secondary set read level offset in response to the relative magnitudes of the value of the error metric for the first primary set read level offset OA and the second primary set read level offset OB and the third primary set read level offset OC corresponding with the seventh five point case. Once again, according to an aspect, the primary set step size and secondary step size are greater than the tertiary set step size.

As discussed, the memory apparatus can further include an error correcting code engine (e.g., ECC engine 122 of FIGS. 1 and 8) configured to generate a syndrome weight corresponding to a failure bit count of data being read from the memory cells. Thus, the error metric can be the syndrome weight. Thus, according to an aspect, the method further includes the step of determining the value of the syndrome weight for each of the primary set of read level offsets and the primary set of read level offsets using the error correcting code engine.

According to other aspects, it is also contemplated that the bit error rate estimation scan technique described above with reference back to FIGS. 15-20 may be optimized, for example using actual values of voltage bands and syndrome weights. In addition, finer differential voltage reads around optimum obtained from stage 2 could further improve accuracy. As stage 1 and stage 2 as described above result in fewer reads than the example bit error rate estimation scan technique of FIGS. 13 and 14, including and/or repeating a stage 3 with even finer resolution could be added without adding significantly amounts of time necessary.

The memory apparatus and method of operation disclosed herein provides numerous advantages. Specifically, because the memory apparatus and method of operation disclosed herein using the bit error rate estimation scan technique described above, relatively lower FBC can be realized. Specifically, with a single BES-5 (without the additional reads of FIG. 19), the FBC should be better, as the A Vt is smaller compared to the example bit error rate estimation scan technique of FIGS. 13 and 14. The hit rate of the reads in FIG. 19 for medium to low disturbance blocks is reduced resulting in improved total system read performance. In addition, parasitic read disturb due to multiple read data points is also reduced. This is especially important for newer memory apparatuses with more word lines. The curve fitting results can also be improved because of the finer step size.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in can be directly on the other layer of substrate, or intervening layers may also be present. Further, it will be understood that when a layer is referred to as being "under" another layer, it can be directly under, and one or more intervening layers may also be present. Furthermore, when a layer is referred to as "between" two layers, it can be the only layer between the two layers, or one or more intervening layers may also be present.

As described herein, a controller includes individual circuit components, an application-specific integrated circuit (ASIC), a microcontroller with controlling software, a digital signal processor (DSP), a processor with controlling software, a field programmable gate array (FPGA), or combinations thereof.

What is claimed is:

1. A method of operating a memory apparatus including memory cells configured to retain a threshold voltage corresponding to one of a plurality of data states, the method comprising the steps of:

reading the memory cells using a primary set of read level offsets from a default read level associated with one of the plurality of data states and determine a value of an error metric for each of the primary set of read level offsets;

reading the memory cells using a secondary set of read level offsets from the default read level associated with the one of the plurality of data states and determining the value of the error metric for each of the secondary set of read level offsets, the secondary set of read level offsets based on the value of the error metric for each one of the read level offsets of the primary set; and reading the memory cells at an optimum read level associated with the one of the plurality of data states and determined based on analysis of the value of the error metric for each of the read level offsets of both the primary set and the secondary set, wherein the primary set of read level offsets includes a first primary set read level offset and a second primary set read level offset and a third primary set read level offset, the first primary set read level offset is less than the second primary set read level offset by a primary set step size and the third primary set read level offset is greater than the second primary set read level offset by the primary set step size, a plurality of three point cases correspond to and are defined by relative magnitudes of the value of the error metric for the first primary set read level offset and the second primary set read level offset and the third primary set read level offset, and the method further includes the step of selecting the secondary set of read level offsets according to which of the plurality of three point cases corresponds to the relative magnitudes of the value of the error metric for the first primary set read level offset and the second primary set read level offset and the third primary set read level offset, the secondary set of the read level offsets being less than the first primary set read level offset or greater than the third primary set read level offset.

2. The method as set forth in claim 1, wherein the secondary set of read level offsets includes, in order of increasing value, a first secondary set read level offset and a second secondary set read level offset and a third secondary set read level offset and a fourth secondary set read level offset, the second secondary set read level offset is less than the first primary set read level offset by a secondary set step size and the first secondary set read level offset is less than the second secondary set read level offset by the secondary set step size and the third secondary set read level offset is greater than the third primary set read level offset by the secondary set step size and the fourth secondary set read level offset is greater than the third secondary set read level offset by the secondary set step size, a plurality of five point cases correspond to and are defined by relative magnitudes of the value of the error metric for the first secondary set read level offset and the second secondary set read level offset and the first primary set read level offset and the second primary set read level offset and the third primary set read level offset and the third secondary set read level offset and the fourth secondary set read level offset, and the method further includes the step of reading the memory cells using particular read level offsets of the secondary set corresponding with the one of the plurality of data states and determining the value of the error metric for each of the particular read level offsets of the secondary set in response to the relative magnitudes of the value of the error metric for the first primary set read level offset and the second primary set read level offset and the third primary set read level offset corresponding with one or more of the plurality of five point cases, the particular read level offsets of the secondary set selected according to which of the plurality of five point cases corresponds to the relative magnitudes of the value of the error metric for the first primary set read level offset and the second primary set read level offset and the third primary set read level offset.

3. The method as set forth in claim 2, wherein the primary set step size is equal to the secondary set step size.

4. The method as set forth in claim 2, wherein the secondary set of read level offsets include, in order of increasing value and each separated from one another by a tertiary set step size, a fifth secondary set read level offset and a sixth secondary set read level offset and a seventh secondary set read level offset and an eighth secondary set read level and the first secondary set read level offset and a ninth secondary set read level offset and the second secondary set read level offset and a tenth secondary set read level offset and an eleventh secondary set read level offset and a twelfth secondary set read level offset and a thirteenth secondary set read level offset and the third secondary set read level offset and a fourteenth secondary set read level offset and the fourth secondary set read level offset and a fifteenth secondary set read level offset and a sixteenth secondary set read level offset and a seventeenth secondary set read level offset and an eighteenth secondary set read level offset, and the method further includes the step of reading the memory cells using specific read level offsets of the secondary set corresponding with the one of the plurality of data states and determine the value of the error metric for each of the specific read level offsets of the secondary set in response to the relative magnitudes of the value of the error metric for the first primary set read level offset and the second primary set read level offset and the third primary set read level offset corresponding with one or more of the plurality of five point cases, the specific read level offsets of the secondary set selected according to which of the plurality of five point cases corresponds to the relative magnitudes of the value of the error metric for the first primary set read level offset and the second primary set read level offset and the third primary set read level offset.

5. The method as set forth in claim 4, wherein the primary set step size and secondary step size are greater than the tertiary set step size.

6. The method as set forth in claim 1, wherein the memory apparatus further includes an error correcting code engine configured to generate a syndrome weight corresponding to a failure bit count of data being read from the memory cells, the error metric is the syndrome weight, and the method further includes the step of determining the value of the syndrome weight for each of the primary set of read level offsets and the primary set of read level offsets using the error correcting code engine.

\* \* \* \* \*